US011762291B2

(12) United States Patent
Toyooka

(10) Patent No.: US 11,762,291 B2
(45) Date of Patent: *Sep. 19, 2023

(54) TRANSFER FILM, ELECTRODE PROTECTIVE FILM, LAMINATE, CAPACITIVE INPUT DEVICE, AND MANUFACTURING METHOD OF TOUCH PANEL

(71) Applicant: FUJIFILM Corporation, Tokyo (JP)

(72) Inventor: Kentaro Toyooka, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 612 days.

This patent is subject to a terminal disclaimer.

(21) Appl. No.: 16/426,234

(22) Filed: May 30, 2019

(65) Prior Publication Data

US 2019/0285986 A1   Sep. 19, 2019

Related U.S. Application Data

(63) Continuation of application No. PCT/JP2017/040641, filed on Nov. 10, 2017.

(30) Foreign Application Priority Data

Dec. 8, 2016  (JP) ................................. 2016-238870
Jun. 9, 2017  (JP) ................................. 2017-114643

(51) Int. Cl.
| G03F 7/035 | (2006.01) |
| G03F 7/038 | (2006.01) |
| G03F 7/027 | (2006.01) |
| G03F 7/031 | (2006.01) |
| G03F 7/033 | (2006.01) |
| G06F 3/044 | (2006.01) |
| C08J 5/18  | (2006.01) |
| G03F 7/16  | (2006.01) |
| G06F 3/041 | (2006.01) |
| G03F 7/004 | (2006.01) |
| G03F 7/20  | (2006.01) |
| G03F 7/32  | (2006.01) |
| G03F 7/40  | (2006.01) |

(52) U.S. Cl.
CPC ............... *G03F 7/033* (2013.01); *C08J 5/18* (2013.01); *G03F 7/004* (2013.01); *G03F 7/027* (2013.01); *G03F 7/031* (2013.01); *G03F 7/035* (2013.01); *G03F 7/161* (2013.01); *G06F 3/041* (2013.01); *G06F 3/0443* (2019.05); *G06F 3/0445* (2019.05); *C08J 2333/10* (2013.01); *G03F 7/20* (2013.01); *G03F 7/32* (2013.01); *G03F 7/40* (2013.01); *G06F 2203/04103* (2013.01)

(58) Field of Classification Search
CPC .......... G03F 7/031; G03F 7/033; G03F 7/035; G03F 7/027
See application file for complete search history.

(56) References Cited

U.S. PATENT DOCUMENTS

| 5,085,889 A * | 2/1992 | Platz ...................... G11B 5/84 252/62.54 |
| 5,728,505 A * | 3/1998 | Dueber .................. G03F 7/033 430/910 |
| 10,649,590 B2 * | 5/2020 | Toyooka ................. B32B 27/36 |
| 2011/0151195 A1 | 6/2011 | Mitsukura et al. |
| 2017/0146905 A1 | 5/2017 | Aridomi et al. |
| 2017/0157899 A1 | 6/2017 | Kanna et al. |
| 2017/0364177 A1 | 12/2017 | Toyooka |
| 2021/0198406 A1* | 7/2021 | Toyooka ................. B32B 27/08 |

FOREIGN PATENT DOCUMENTS

| JP | 2005-31647 A | 2/2005 |
| JP | 2008-180992 A | 8/2008 |
| JP | 2009-9107 A | 1/2009 |
| JP | 2010-223992 A | 10/2010 |
| JP | 2010-282067 A | 12/2010 |
| JP | 2011-170011 A | 9/2011 |
| JP | 2012-103587 A | 5/2012 |
| JP | 2012-137745 A | 7/2012 |
| JP | 2013-029781 A | 2/2013 |
| JP | 5304973 B1 | 10/2013 |
| JP | 2014-189657 A | 10/2014 |
| JP | 2016-080921 A | 5/2016 |
| JP | 2016-160393 A | 9/2016 |
| JP | 2016-180929 A | 10/2016 |
| JP | 2016-181083 A | 10/2016 |
| TW | 201608340 A | 3/2016 |

(Continued)

OTHER PUBLICATIONS

Communication dated Jan. 21, 2020, from the Japanese Patent Office in Application No. 2018-554880.
International Search Report dated Jan. 9, 2018, issued by the International Searching Authority in application No. PCT/JP2017/040641.
Written Opinion dated Jan. 9, 2018, issued by the International Searching Authority in application No. PCT/JP2017/040641.
International Preliminary Report on Patentability dated Jun. 11, 2019, issued by the International Bureau in application No. PCT/JP2017/040641.

(Continued)

*Primary Examiner* — John S Chu
(74) *Attorney, Agent, or Firm* — Sughrue Mion, PLLC

(57) ABSTRACT

A transfer film includes a temporary support; and a photosensitive transparent resin layer positioned on the temporary support, in which the photosensitive transparent resin layer includes a binder polymer, an ethylenically unsaturated compound, a photopolymerization initiator, and a compound capable of reacting with acid due to heating, and the compound capable of reacting with acid due to heating includes a polymerizable group. In addition, an electrode protective film using the transfer film, a laminate, a capacitive input device, and a manufacturing method of a touch panel are provided.

11 Claims, 2 Drawing Sheets

(56) References Cited

FOREIGN PATENT DOCUMENTS

| | | |
|---|---|---|
| TW | 201609382 A | 3/2016 |
| WO | 2016/152373 A1 | 9/2016 |
| WO | 2016/159043 A1 | 10/2016 |
| WO | 2017/110689 A1 | 6/2017 |

OTHER PUBLICATIONS

Office Action dated Sep. 14, 2021 from the Taiwanese Intellectual Property Office in TW Application No. 106140407.
Office Action dated Dec. 20, 2021 from the China National Intellectual Property Administration in CN Application No. 201780072417.0.
Office Action dated May 11, 2022 in Chinese Application No. 201780072417.0.

* cited by examiner

TRANSFER FILM, ELECTRODE PROTECTIVE FILM, LAMINATE, CAPACITIVE INPUT DEVICE, AND MANUFACTURING METHOD OF TOUCH PANEL

CROSS-REFERENCE TO RELATED APPLICATIONS

This application is a Continuation of International Application No. PCT/JP2017/040641 filed on Nov. 10, 2017, which claims priority to Japanese Patent Application No. 2016-238870 filed on Dec. 8, 2016, and Japanese Patent Application No. 2017-114643 filed on Jun. 9, 2017. The entire contents of these applications are incorporated herein by reference.

BACKGROUND OF THE INVENTION

1. Field of the Invention

The present disclosure relates to a transfer film, an electrode protective film, a laminate, a capacitive input device, and a manufacturing method of a touch panel.

2. Description of the Related Art

In recent years, in electronic devices such as a mobile phone, a car navigator, a personal computer, a ticket vending machine, or a terminal of the bank, a tablet type input device is disposed on a surface of a liquid crystal device or the like. There is provided a device to which information corresponding to an instruction image is input, by touching a portion, where the instruction image is displayed, with fingers or a touch pen, while referring to the instruction image displayed in an image display region of a liquid crystal device.

The input device described above (hereinafter, may be referred to as a touch panel) may include a resistance film type input device, a capacitive input device, and the like. The capacitive input device is advantageous in that a transmittance conductive film may be simply formed on one sheet of substrate. In such a capacitive input device, there is provided a device in which electrode patterns are extended in directions orthogonal to each other, and which detects an input position by detecting a change of electrostatic capacity between electrodes, in a case where a finger or the like is touched.

In order to protect electrode patterns or leading wirings (for example, metal wirings such as copper wires) put together on a frame portion of the capacitive input device, a transparent resin layer is provided on a side opposite to the surface for the inputting with a finger or the like.

In a case using these capacitive input devices, in a case of visually recognizing a surface of a touch panel on a position slightly separated from a vicinity of a regular reflected portion of incident light from a light source, transparent electrode patterns present inside are visually recognized, and this may become an appearance defect. Accordingly, it is necessary to improve concealing properties of the transparent electrode patterns on the surface of a touch panel or the like.

In addition, a technology of forming a protective film of an electrode for a touch panel using a photosensitive resin composition has been also known.

For example, a forming method of a protective film of an electrode for a touch panel capable of forming a protective film having sufficient rust inhibiting properties even with a small thickness on a predetermined electrode for a touch panel, including: providing a photosensitive layer formed of a photosensitive resin composition including a binder polymer including a carboxyl group and in which an acid value is 30 mgKOH/g to 120 mgKOH/g, a photopolymerizable compound including at least three ethylenically unsaturated groups, and a photopolymerization initiator, on a substrate including the electrode for a touch panel, curing a predetermined portion of the photosensitive layer by emitting an actinic ray and removing a portion other than the predetermined portion, and forming a protective film formed of the cured product of the predetermined portion of the photosensitive layer covering a part or the entire electrode described above (for example, see JP5304973B).

JP2016-181083A discloses a transfer film for protecting electrodes of a capacitive input device, the transfer film including: a temporary support; and a photosensitive transparent resin layer formed on the temporary support, in which the photosensitive transparent resin layer includes a binder polymer, a photopolymerizable compound including an ethylenically unsaturated group, a photopolymerization initiator, and blocked isocyanate, and the binder polymer is a carboxyl group-containing acrylic resin having an acid value equal to or greater than 60 mgKOH/g.

SUMMARY OF THE INVENTION

In general, a cured film is formed on a substrate by forming a photosensitive layer on a substrate, performing a pattern exposure with respect to the photosensitive layer formed on the substrate, and developing the pattern-exposed photosensitive layer, by using a transfer film including a temporary support and a photosensitive layer including solid contents of the photosensitive resin composition.

Perspiration resistance, that is, wet heat resistance after applying salt water may be required with respect to the cured film described above. For example, in a case of forming a protective film for a touch panel as the cured film described above, wet heat resistance after applying salt water is required with respect to the protective film for a touch panel to be formed (details thereof will be described later).

Regarding this point, from the studies of the inventors, it has been determined that wet heat resistance after applying salt water tends to be deteriorated in the cured film manufactured using a photosensitive resin composition disclosed in JP5304973B.

In addition, from the studies of the inventors, it was determined that, in a transfer film including a photosensitive transparent resin layer including a blocked isocyanate compound as a transfer film disclosed in JP2016-181083A, the wet heat resistance after applying salt water of a cured film to be obtained is excellent, but a surface of the photosensitive transparent resin layer may have defects such as swelling or depression and a problem regarding the surface shape tends to occur.

An object of one embodiment of the invention is to provide a transfer film capable of forming a cured film having excellent wet heat resistance after applying salt water and surface shape of the surface.

In addition, other objects of the other embodiment of the invention are to provide an electrode protective film using the transfer film, a laminate, a capacitive input device, and a manufacturing method of a touch panel.

Means for achieving the objects described above include the following aspects.

<1> A transfer film comprising:
a temporary support; and
a photosensitive transparent resin layer positioned on the temporary support,
in which the photosensitive transparent resin layer includes a binder polymer, an ethylenically unsaturated compound, a photopolymerization initiator, and a compound capable of reacting with acid due to heating, and
the compound capable of reacting with acid due to heating includes a polymerizable group.

<2> The transfer film according to <1>,
in which the compound capable of reacting with acid due to heating is a blocked isocyanate compound.

<3> The transfer film according to <1> or <2>,
in which the binder polymer is an alkali soluble resin having an acid value equal to or greater than 60 mgKOH/g.

<4> The transfer film according to any one of <1> to <3>, further comprising:
a second transparent resin layer on the photosensitive transparent resin layer,
in which a refractive index of the second transparent resin layer is higher than a refractive index of the photosensitive transparent resin layer.

<5> The transfer film according to any one of <1> to <4>,
in which the polymerizable group in the compound capable of reacting with acid due to heating is an ethylenically unsaturated group.

<6> The transfer film according to <5>,
in which the polymerizable group in the compound capable of reacting with acid due to heating is a (meth) acryloxy group.

<7> The transfer film according to any one of <1> to <6>,
in which the ethylenically unsaturated compound includes an ethylenically unsaturated compound including an acid group.

<8> An electrode protective film, comprising:
the transfer film according to any one of <1> to <7> from which the temporary support has removed.

<9> A laminate comprising: a photosensitive transparent resin layer obtained by removing the temporary support from the transfer film according to any one of <1> to <7>, on a substrate including an electrode of a capacitive input device, in order from the substrate side.

<10> A capacitive input device comprising: the electrode protective film according to <8> or the laminate according to <9>.

<11> A manufacturing method of a touch panel comprising:
preparing a substrate for a touch panel having a structure in which at least one of an electrode for a touch panel or a wiring for a touch panel is disposed on a substrate;
forming a photosensitive layer on a surface of the substrate for a touch panel on a side where at least one of the electrode for a touch panel or the wiring for a touch panel is disposed, by using the transfer film according to any one of <1> to <7>;
performing pattern-exposing on the photosensitive layer formed on the substrate for a touch panel; and
developing the pattern-exposed photosensitive layer to obtain a protective film for a touch panel which protects at least a part of at least one of the electrode for a touch panel or the wiring for a touch panel.

According to the embodiment of the invention, it is possible to provide a transfer film capable of forming a cured film having excellent wet heat resistance after applying salt water and surface shape of the surface.

According to other embodiments of the invention, it is possible to provide an electrode protective film using the transfer film, a laminate, a capacitive input device, and a manufacturing method of a touch panel.

DESCRIPTION OF THE PREFERRED EMBODIMENTS

Figure 1:
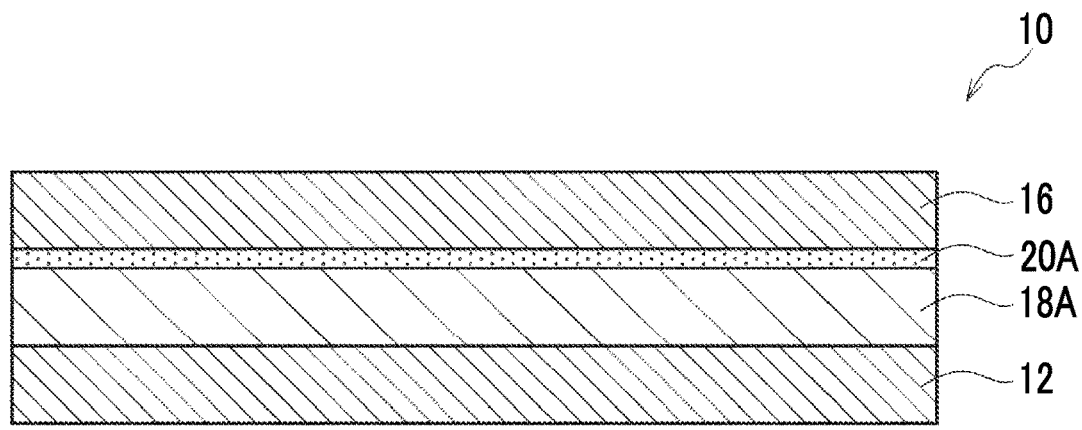
FIG. 1 is a schematic cross sectional view showing an example of a transfer film according to the disclosure.

Hereinafter, the content of the disclosure will be described in detail. The description of configuration elements described below is performed based on the representative embodiments of the disclosure, but the disclosure is not limited to such embodiments.

In the disclosure, a term "to" showing a range of numerical values is used as a meaning including a lower limit value and an upper limit value disclosed before and after the term.

Regarding a term, group (atomic group) of the disclosure, a term with no description of "substituted" and "unsubstituted" includes both a group not including a substituent and a group including a substituent. For example, an "alkyl group" not only includes an alkyl group not including a substituent (unsubstituted alkyl group), but also an alkyl group including a substituent (substituted alkyl group).

In addition, the disclosure, "% by mass" is identical to "% by weight" and "parts by mass" identical to "parts by weight".

Further, in the disclosure, a combination of two or more preferable aspects is the more preferable aspect.

In the disclosure, in a case where a plurality of substances corresponding to components are present in the composition, the amount of each component in the composition means a total amount of the plurality of substances present in the composition, unless otherwise noted.

In the disclosure, a term "step" not only includes an independent step, but also includes a step, in a case where the step may not be distinguished from the other step, as long as the expected object of the step is achieved.

In the disclosure, "(meth)acrylic acid" has a concept including both acrylic acid and a methacrylic acid, "(meth) acrylate" has a concept including both acrylate and methacrylate, and "(meth)acryloyl group" has a concept including both acryloyl group and methacryloyl group.

A weight-average molecular weight (Mw) and a number average molecular weight (Mn) of the disclosure, unless otherwise noted, are detected by a gel permeation chromatography (GPC) analysis device using a column of TSKgel GMHxL, TSKgel G4000HxL, TSKgel G2000HxL (all product names manufactured by Tosoh Corporation), by using tetrahydrofuran (THF) as a solvent and a differential refractometer, and are molecular weights obtained by conversion using polystyrene as a standard substance.

Hereinafter, the disclosure will be described in detail.

[Transfer Film]

A transfer film according to the disclosure includes a temporary support and a photosensitive transparent resin layer positioned on the temporary support, the photosensitive transparent resin layer includes a binder polymer, an ethylenically unsaturated compound, a photopolymerization initiator, and a compound capable of reacting with acid due to heating, and the compound capable of reacting with acid due to heating includes a polymerizable group.

As a result of intensive studies of the inventors, it is found that it is possible to provide a transfer film capable of forming a cured film having excellent wet heat resistance after applying salt water and surface shape of the surface, by using the configuration described above.

An operation mechanism of the excellent effect due to this is not clear, but is assumed as follows.

According to the configuration of the transfer film of the disclosure, by using the compound capable of reacting with acid due to heating, it is expected that, a polymerizable compound and the compound capable of reacting with acid due to heating having a polymerizable group are concertedly operated to a degree of sufficiently blocking salt water and densely form a crosslinked structure, in the photosensitive transparent resin layer after light (ultraviolet light) irradiation and heating, and it is surmised that it is possible to improve wet heat resistance after applying salt water (corresponding to perspiration resistance) of a cured film after exposing and heating the photosensitive transparent resin layer after transfer.

In addition, it is surmised that, it is possible to prevent a deterioration of a surface shape of a surface (occurrence of defects such as swelling or depression of the surface), the detail of which is not clear, but considered to be due to the compound capable of reacting with acid due to heating, and it is possible to form a cured film having excellent surface shape of the surface, by causing the compound capable of reacting with acid due to heating to include a polymerizable group.

<Photosensitive Transparent Resin Layer>

The transfer film according to the disclosure includes the photosensitive transparent resin layer positioned on the temporary support, the photosensitive transparent resin layer includes a binder polymer, an ethylenically unsaturated compound, a photopolymerization initiator, and a compound capable of reacting with acid due to heating, and the compound capable of reacting with acid due to heating includes a polymerizable group.

<<Compound Capable of Reacting with Acid due to Heating>>

The photosensitive transparent resin layer of the transfer film according to the disclosure includes the compound capable of reacting with acid due to heating.

In addition, the compound capable of reacting with acid due to heating used in the disclosure includes a polymerizable group.

The compound capable of reacting with acid due to heating is not particularly limited, as it does not oppose the gist of the disclosure.

The compound capable of reacting with acid due to heating is preferably a compound having high reactivity with acid after heating at a temperature higher than 25° C., compared to the reactivity with acid at 25° C. The compound capable of reacting with acid due to heating is preferably a compound which includes a group capable of reacting with acid which is temporarily inactivated due to a blocking agent and from which a block agent-derived group is dissociated at a predetermined dissociation temperature.

Examples of the compound capable of reacting with acid due to heating include a carboxylic acid compound, an alcohol compound, an amine compound, a blocked isocyanate compound, and an epoxy compound, and a blocked isocyanate compound is preferable, from a viewpoint of wet heat resistance after applying salt water.

In addition, the number of groups capable of reacting with acid due to heating included in the compound capable of reacting with acid due to heating may be 1 or more, is preferably 1 to 10, more preferably 1 to 6, and particularly preferably 1 to 4.

The blocked isocyanate compound is a "compound having a structure in which an isocyanate group of isocyanate is protected (masked) with a blocking agent".

An initial glass transition temperature (Tg) of the blocked isocyanate compound is preferably −40° C. to 10° C. and more preferably −30° C. to 0° C.

A dissociation temperature of the blocked isocyanate compound is preferably 100° C. to 160° C. and more preferably 130° C. to 150° C.

The dissociation temperature of blocked isocyanate in the specification is a "temperature at an endothermic peak accompanied with a deprotection reaction of blocked isocyanate, in a case where the measurement is performed by differential scanning calorimetry (DSC) analysis using a differential scanning calorimeter (manufactured by Seiko Instruments Inc., DSC6200)".

Examples of the blocking agent having a dissociation temperature at 100° C. to 160° C. include a pyrazole compound (3,5-dimethylpyrazole, 3-methylpyrazole, 4-bromo-3,5-dimethylpyrazole, or 4-nitro-3,5-dimethylpyrazole), an active methylene compound (diester malonate (dimethyl malonate, diethyl malonate, di n-butyl malonate, di-2-ethylhexyl malonate)), a triazole compound (1,2,4-triazole), and an oxime compound (compound having a structure represented by —C(=N—OH)— in a molecule such as formaldoxime, acetoaldoxime, acetoxime, methyl ethyl ketoxime, or cyclohexanone oxime). Among these, from a viewpoint of preservation stability, an oxime compound or a pyrazole compound is preferable, and an oxime compound is particularly preferable.

In addition, the blocked isocyanate compound having an isocyanurate structure is preferable, from viewpoints of improving embrittlement of a film and improving adhesiveness with a body to be transferred. The blocked isocyanate compound having an isocyanurate structure can be prepared by isocyanurating and protecting hexamethylene diisocyanate, for example.

Among the blocked isocyanate compounds having an isocyanurate structure, a compound having an oxime structure using the oxime compound as a blocking agent is preferable, from viewpoints of easily setting the dissociation temperature in a preferred range and reducing a development residue, compared to a case of the compound not having an oxime structure.

The compound capable of reacting with acid due to heating used in the disclosure includes a polymerizable group in a molecule.

The polymerizable group is not particularly limited, and a well-known polymerizable group can be used. Examples thereof include an ethylenically unsaturated group such as a (meth)acryloxy group, a (meth)acrylamide group, a styryl group, and an epoxy group such as a glycidyl group. Among these, as the polymerizable group, an ethylenically unsaturated group is preferable, and a (meth)acryloxy group is more preferable, from viewpoints of surface shape of the surface of the cured film to be obtained, a development speed, and reactivity.

As the blocked isocyanate compound including the polymerizable group used in the disclosure, a commercially available blocked isocyanate compound can also be used. Examples thereof include Karenz AOI-BM, Karenz MOI-BM, Karenz MOI-BP (all manufactured by Showa Denko K.K.)

A molecular weight of the blocked isocyanate compound used in the disclosure is preferably 200 to 3,000, more preferably 250 to 2,600, and particularly preferably 280 to 2,200.

As the compound capable of reacting with acid due to heating, an epoxy compound is used.

The epoxy compound is not particularly limited, and a well-known compound can be used.

As the epoxy compound, a compound disclosed in paragraphs 0096 to 0098 of JP2015-135396A can be preferably used, and the content of this publication is incorporated in the specification.

As an example of the epoxy compound, EPOX-MK R151 (manufactured by Printec Co.) can be used.

In the disclosure, the compound capable of reacting with acid due to heating may be used alone or in combination of two or more kinds thereof.

A content of the compound capable of reacting with acid due to heating is preferably 1% by mass to 50% by mass and more preferably 5% by mass to 30% by mass, with respect to a total content of the photosensitive transparent resin layer.

<<Binder Polymer>>

The photosensitive transparent resin layer of the transfer film according to the disclosure includes a binder polymer.

The binder polymer is preferably an alkali soluble resin.

An acid value of the binder polymer is not particularly limited, and a binder polymer having an acid value equal to or greater than 60 mgKOH/g is preferable, an alkali soluble resin having an acid value equal to or greater than 60 mgKOH/g is more preferable, and an carboxyl group-containing acrylic resin having an acid value equal to or greater than 60 mgKOH/g is particularly preferable, from a viewpoint of the wet heat resistance after applying salt water.

It is assumed that, since the binder polymer has the acid value described above, the binder polymer is thermally crosslinked with the compound capable of reacting with acid due to heating and it is possible to increase a three-dimensional crosslink density. In addition, it is assumed that a carboxyl group of the carboxyl group-containing acrylic resin is subjected to anhydrization and hydrophobization and contributes to the improvement of the wet heat resistance.

The carboxyl group-containing acrylic resin having an acid value equal to or greater than 60 mgKOH/g (hereinafter, also referred to as a specific polymer A) is not particularly limited, as long as the condition of the acid value is satisfied, and a resin can be suitably selected and used from well-known resins.

For example, a binder polymer which is a carboxyl group-containing acrylic resin having an acid value equal to or greater than 60 mgKOH/g among polymers disclosed in a paragraph 0025 of JP2011-095716A, A carboxyl group-containing acrylic resin having an acid value equal to or greater than 60 mgKOH/g among polymers disclosed in paragraphs 0033 to 0052 of JP2010-237589A can be preferably used as the specific polymer A of the embodiment.

Here, the (meth)acrylic resin indicates a resin including at least one of a structural unit derived from a (meth)acrylic acid or a structural unit derived from (meth)acrylic acid ester.

A total percentage of the structural unit derived from a (meth)acrylic acid and the structural unit derived from (meth)acrylic acid ester in the (meth)acrylic resin is preferably equal to or greater than 30% by mol and more preferably equal to or greater than 50% by mol.

A preferred range of a copolymerization ratio of a monomer including a carboxyl group in the specific polymer A is 5% by mass to 50% by mass, more preferably 5% by mass to 40% by mass, and even more preferably 20% by mass to 30% by mass, with respect to 100% by mass of the polymer.

The specific polymer A may include a reactive group, and as means for introducing the reactive group to the specific polymer A, a method of causing an epoxy compound, blocked isocyanate, isocyanate, a vinyl sulfone compounds, an aldehyde compound, a methylol compound, or a carboxylic acid anhydride to react with a hydroxyl group, a carboxyl group, a primary amino group, a secondary amino group, an acetoacetyl group, or a sulfonic acid group is used.

As the specific polymer A, a compound A shown below is preferable. A content ratio of each structural unit shown below can be suitably changed according to the purpose.

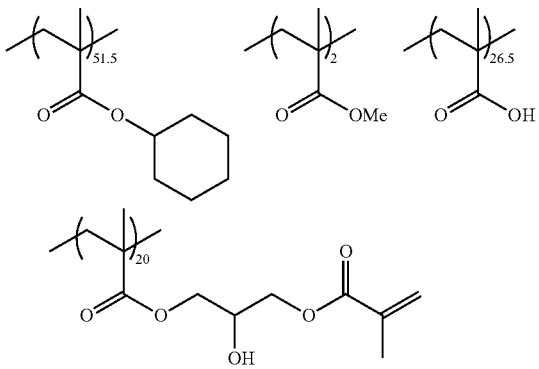

Compound A

An acid value of the binder polymer used in the disclosure is preferably 60 mgkOH/g to 200 mgkOH/g, more preferably 60 mgkOH/g to 150 mgkOH/g, and even more preferably 60 mgkOH/g to 110 mgkOH/g.

In the specification, the acid value means a value measured based on a method disclosed in JIS K0070 (1992).

Since the binder polymer includes a binder polymer having an acid value equal to or greater than 60 mgKOH/g and a second transparent resin layer which will be described later includes an acrylic resin including an acid group, it is possible to increase inter-layer adhesiveness between the photosensitive transparent resin layer and the second transparent resin layer, in addition to the advantages described above.

A weight-average molecular weight of the specific polymer A is preferably equal to or greater than 10,000 and more preferably 20,000 to 100,000.

As the binder polymer, any film forming resin can be suitably selected and used according to the purpose, in addition to the specific polymer. From a viewpoint of using the transfer film as an electrode protective film of a capacitive input device, a film having excellent surface hardness and heat resistance is preferable, and an alkali soluble resin is more preferable, and among the alkali soluble resins, a well-known photosensitive siloxane resin material or the like can be preferably used.

The binder polymer used in the disclosure preferably includes a polymer having a structural unit having a carboxylic acid anhydride structure (hereinafter, also referred to as a specific polymer B). By including the specific polymer B, more excellent wet heat resistance after applying salt water of the cured film to be obtained is obtained.

The carboxylic acid anhydride structure may be any of a chain carboxylic acid anhydride structure and a cyclic carboxylic acid anhydride structure, and the cyclic carboxylic acid anhydride structure is preferable.

The ring of the cyclic carboxylic acid anhydride structure is preferably 5- to 7-membered ring, more preferably 5- or 6-membered ring, and more preferably 5-membered ring.

In addition, the cyclic carboxylic acid anhydride structure may form a polycyclic structure by annelation or bonding to other cyclic structures, but it is preferable that a polycyclic structure is not formed.

In a case where a polycyclic structure is formed by annelation or bonding of other cyclic structures to the cyclic carboxylic acid anhydride structure, a bicyclo structure or spiro structure is preferable as the polycyclic structure.

In the polycyclic structure, the number of other cyclic structures forming a ring with or bonded to the cyclic carboxylic acid anhydride structure is preferably 1 to 5 and more preferably 1 to 3.

Examples of the other cyclic structure include a cyclic hydrocarbon group having 3 to 20 carbon atoms and a heterocyclic group having 3 to 20 carbon atoms.

The heterocyclic group is not particularly limited, and examples thereof include an aliphatic heterocyclic group and an aromatic heterocyclic group.

In addition, the heterocyclic group is preferably 5-membered ring or 6-membered ring and particularly preferably 5-membered ring.

As the heterocyclic group, a heterocyclic group including at least one oxygen atom (for example, an oxolane ring, an oxane ring, or a dioxane ring) is preferable.

The structural unit having a carboxylic acid anhydride structure is preferably a structural unit including divalent group excluding two hydrogen atoms from a compound represented by Formula 2 in a main chain, or a structural unit in which monovalent group excluding one hydrogen atom from the compound represented by Formula 2 is bonded to a main chain directly or through a divalent linking group.

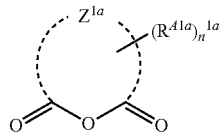

Formula 2

In Formula 2, $R^{A1a}$ represents a substituent, and $n^{1a}R^{A1a}$'s may be the same as or different from each other.

$Z^{1a}$ represents a divalent group forming a ring including —C(=O)—O—C(=O)—. $n^{1a}$ represents an integer equal to or greater than 0.

As the substituent represented by $R^{A1a}$, a component same as a substituent which may be included in the carboxylic acid anhydride structure is used, and the preferred range is also same.

$Z^{1a}$ is preferably an alkylene group having 2 to 4 carbon atoms, more preferably an alkylene group having 2 or 3 carbon atoms, and particularly preferably an alkylene group having 2 carbon atoms.

A partial structure represented by Formula 2 may form a polycyclic structure by annelation or bonding to other cyclic structures, but it is preferable that a polycyclic structure is not formed.

As the other cyclic structure here, a structure same as the other cyclic structure described above which may form a ring with or be bonded to the carboxylic acid anhydride structure is used, and the preferred range is also same.

$n^{1a}$ represents an integer equal to or greater than 0.

In a case where $Z^{1a}$ represents an alkylene group having 2 to 4 carbon atoms, $n^{1a}$ is preferably an integer of 0 to 4, more preferably an integer of 0 to 2, and even more preferably 0.

In a case where $n^{1a}$ represents an integer equal to or greater than 2, a plurality of $R^{A1a}$'s may be same as or different from each other. In addition, a plurality of $R^{A1a}$'s may be bonded to each other to form a ring, but it is preferable that a plurality of $R^{A1a}$'s are not bonded to each other to form a ring.

The structural unit having a carboxylic acid anhydride structure is preferably a structural unit derived from an unsaturated carboxylic acid anhydride, more preferably a structural unit derived from an unsaturated cyclic carboxylic acid anhydride, even more preferably a structural unit derived from an unsaturated aliphatic cyclic carboxylic acid anhydride, still preferably a structural unit derived from a maleic anhydride or an itaconic acid anhydride, and particularly preferably a structural unit derived from a maleic anhydride.

Hereinafter, specific examples of the structural unit having a carboxylic acid anhydride structure are described, but the structural unit having a carboxylic acid anhydride structure is not limited to these specific examples.

In the following structural units, Rx represents a hydrogen atom, a methyl group, a CH$_2$OH group, or a CF$_3$ group, and Me represents a methyl group.

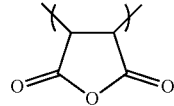

Formula a2-1

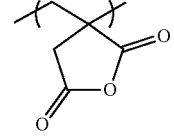

Formula a2-2

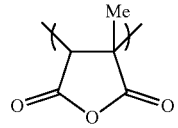

Formula a2-3

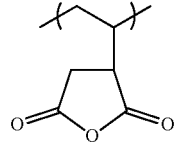

Formula a2-4

-continued
Formula a2-5
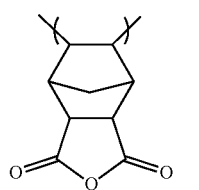
Formula a2-6
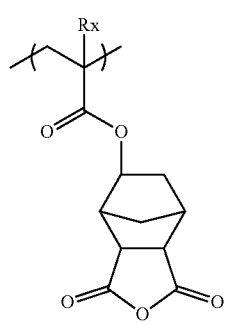
Formula a2-7
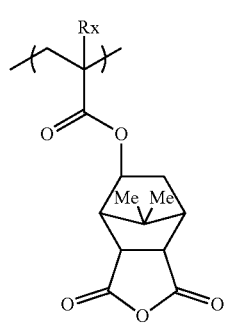
Formula a2-8
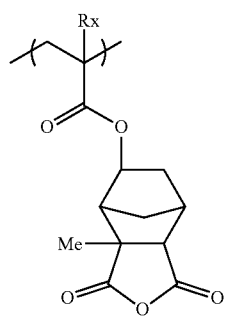
Formula a2-9
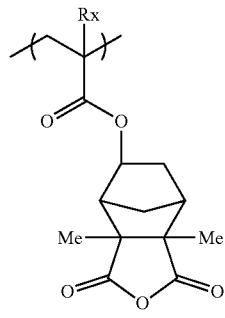
-continued
Formula a2-10
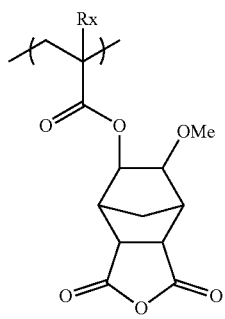
Formula a2-11
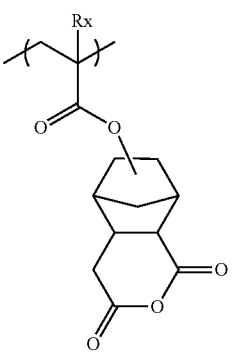
Formula a2-12
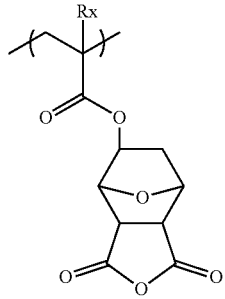
Formula a2-13
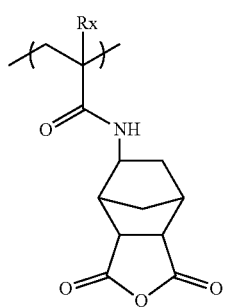
Formula a2-14
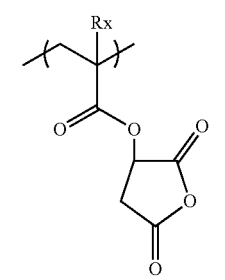

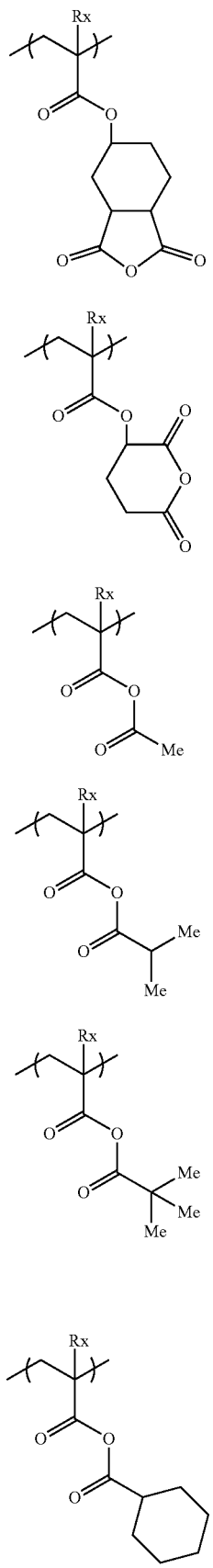

Formula a2-15

Formula a2-16

Formula a2-17

Formula a2-18

Formula a2-19

Formula a2-20

Formula a2-21

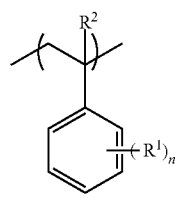

The structural unit having a carboxylic acid anhydride structure is preferably at least one kind of the structural units represented by any of Formula a2-1 to Formula a2-21, and more preferably one kind of the structural units represented by any of Formula a2-1 to Formula a2-21.

From viewpoints of perspiration resistance improvement of the cured film and development residue prevention in a case of using the transfer film, the structural unit having a carboxylic acid anhydride structure preferably includes at least one of the structural unit represented by Formula a2-1 or the structural unit represented by Formula a2-2, and more preferably includes the structural unit represented by Formula a2-1.

A content of the structural unit having a carboxylic acid anhydride structure in the specific polymer B (a total content, in a case of two or more kinds of structural units. The same applies hereinafter) is preferably 0% by mol to 60% by mol, more preferably 5% by mol to 40% by mol, and even more preferably 10% by mol to 35% by mol, with respect to a total amount of the specific polymer B.

The specific polymer B preferably includes at least one kind of structural unit represented by Formula 1. Accordingly, hydrophobicity and hardness of the cured film to be formed are further improved.

Formula 1

In Formula 1, $R^1$ represents a hydroxyl group, an alkyl group, an aryl group, an alkoxy group, a carboxyl group, or a halogen atom, $R^2$ represents a hydrogen atom, an alkyl group, or an aryl group, and n represents an integer of 0 to 5. In a case where n is an integer equal to or greater than 2, two or more $R^1$'s may be the same as or different from each other.

$R^1$ is preferably an alkyl group having 1 to 10 carbon atoms, an aryl group having 6 to 12 carbon atoms, an alkoxy group having 1 to 10 carbon atoms, a carboxyl group, an F atom, a Cl atom, a Br atom, or an I atom, and more preferably an alkyl group having 1 to 4 carbon atoms, a phenyl group, an alkoxy group having 1 to 4 carbon atoms, a Cl atom, or a Br atom.

$R^2$ is preferably a hydrogen atom, an alkyl group having 1 to 10 carbon atoms, or an aryl group having 6 to 12 carbon atoms, more preferably a hydrogen atom or an alkyl group having 1 to 4 carbon atoms, even more preferably a hydrogen atom, a methyl group, or an ethyl group, and particularly preferably a hydrogen atom.

n is preferably an integer of 0 to 3, more preferably 0 or 1, and even more preferably 0.

The structural unit represented by Formula 1 is preferably a structural unit derived from a styrene compound.

Examples of the styrene compound include styrene, p-methylstyrene, α-methylstyrene, α,p-dimethylstyrene, p-ethylstyrene, p-t-butylstyrene, and 1,1-diphenylethylene, styrene or α-methylstyrene is preferable, and styrene is particularly preferable.

The styrene compound for forming the structural unit represented by Formula 1 may be only one kind or two or more kinds thereof.

In a case where the specific polymer B includes the structural unit represented by Formula 1, a content of the structural unit represented by Formula 1 in the specific polymer B (a total content, in a case of two or more kinds of structural units. The same applies hereinafter) is preferably 5% by mol to 90% by mol, more preferably 30% by mol to 90% by mol, and even more preferably 40% by mol to 90% by mol, with respect to a total amount of the specific polymer B.

The specific polymer B may include at least one kind of structural units other than the structural unit having a carboxylic acid anhydride structure and the structural unit represented by Formula 1.

It is preferable that the other structural unit does not include an acid group.

The other structural unit is not particularly limited, and a structural unit derived from a monofunctional ethylenically unsaturated compound is used.

As the monofunctional ethylenically unsaturated compound, a well-known compound can be used without particular limitations, and examples thereof include a (meth)acrylic acid derivative such as methyl (meth)acrylate, ethyl (meth)acrylate, n-butyl (meth)acrylate, 2-ethylhexyl (meth)acrylate, carbitol (meth)acrylate, cyclohexyl (meth)acrylate, benzyl (meth)acrylate, and epoxy (meth)acrylate; an N-vinyl compound such as N-vinyl pyrrolidone or N-vinyl caprolactam; and a derivative of an allyl compound such as allyl glycidyl ether.

A content of the other structural unit in the specific polymer B (a total content, in a case of two or more kinds of structural units) is preferably 10% by mass to 100% by mass and more preferably 50% by mass to 100% by mass, with respect to a total amount of the specific polymer B.

The binder polymer may be used alone or in combination of two or more kinds thereof.

A content of the binder polymer in the photosensitive transparent resin layer is preferably 10% by mass to 90% by mass, more preferably 20% by mass to 80% by mass, and even more preferably 30% by mass to 70% by mass, with respect to a total mass of the photosensitive transparent resin layer, from viewpoints of photosensitivity and hardness of the cured film.

<<Ethylenically Unsaturated Compound>>

The photosensitive transparent resin layer of the transfer film according to the disclosure includes an ethylenically unsaturated compound.

The ethylenically unsaturated compound is a component contributing to photosensitivity of the photosensitive transparent resin layer (that is, photocuring properties) and hardness of the cured film.

The "ethylenically unsaturated compound" of the disclosure is a compound not including a group capable of reacting with acid due to heating.

The ethylenically unsaturated compound is a compound including one or more ethylenically unsaturated groups.

The photosensitive transparent resin layer preferably includes di- or higher functional ethylenically unsaturated compounds as the ethylenically unsaturated compound.

Here, the di- or higher functional ethylenically unsaturated compound means a compound including two or more ethylenically unsaturated groups in one molecule.

The ethylenically unsaturated group is more preferably a (meth)acryloyl group.

The ethylenically unsaturated compound is preferably a (meth)acrylate compound.

The photosensitive transparent resin layer particularly preferably includes a difunctional ethylenically unsaturated compound (preferably, a difunctional (meth)acrylate compound) and a tri- or higher functional ethylenically unsaturated compound (preferably, a tri- or higher functional (meth)acrylate compound), from a viewpoint of further improving the wet heat resistance after applying salt water of the cured film.

The difunctional ethylenically unsaturated compound is not particularly limited and can be suitably selected from well-known compounds.

Examples of the difunctional ethylenically unsaturated compound include tricyclodecane dimethanol di(meth)acrylate, 1,9-nonanediol di(meth)acrylate, and 1,6-hexanediol di(meth)acrylate.

More specific examples of the difunctional ethylenically unsaturated compound include tricyclodecanedimethanol diacrylate (A-DCP manufactured by Shin-Nakamura Chemical Co., Ltd.), tricyclodecanedimethanol dimethacrylate (DCP manufactured by Shin-Nakamura Chemical Co., Ltd.), 1,9-nonanediol diacrylate (A-NOD-N manufactured by Shin-Nakamura Chemical Co., Ltd.), and 1,6-hexanediol diacrylate (A-HD-N manufactured by Shin-Nakamura Chemical Co., Ltd.).

The tri- or higher functional ethylenically unsaturated compound is not particularly limited and can be suitably selected from well-known compounds.

Examples of the tri- or higher functional ethylenically unsaturated compound include dipentaerythritol (tri/tetra/penta/hexa) (meth)acrylate, pentaerythritol (tri/tetra) (meth)acrylate, trimethylolpropane tri(meth)acrylate, ditrimethylolpropane tetra(meth)acrylate, isocyanuric acid (meth)acrylate, and a (meth)acrylate compound of a glycerin tri(meth)acrylate skeleton.

Here, the "(tri/tetra/penta/hexa) (meth)acrylate" has a concept including tri(meth)acrylate, tetra(meth)acrylate, penta(meth)acrylate, and hexa(meth)acrylate, and the "(tri/tetra) (meth)acrylate" has a concept including tri(meth)acrylate and tetra(meth)acrylate.

Examples of the ethylenically unsaturated compound include a caprolactone-modified compound of a (meth)acrylate compound (KAYARAD (registered trademark) DPCA-20 manufactured by Nippon Kayaku Co., Ltd., A-9300-1CL manufactured by Shin-Nakamura Chemical Co., Ltd.), an alkylene oxide-modified compound of a (meth)acrylate compound (KAYARAD RP-1040 manufactured by Nippon Kayaku Co., Ltd., ATM-35E, A-9300 manufactured by Shin-Nakamura Chemical Co., Ltd., EBECRYL (registered trademark) 135 manufactured by Daicel-Allnex Ltd.), and ethoxylated glycerin triacrylate (A-GLY-9E manufactured by Shin-Nakamura Chemical Co., Ltd.).

As the ethylenically unsaturated compound, a urethane (meth)acrylate compound (preferably tri- or higher functional urethane (meth)acrylate compound) is also used.

Examples of the tri- or higher functional urethane (meth) acrylate compound include 8UX-015A (manufactured by Taisei Fine Chemical Co., Ltd.), UA-32P (manufactured by Shin-Nakamura Chemical Co., Ltd.), and UA-1100H (manufactured by Shin-Nakamura Chemical Co., Ltd.).

The ethylenically unsaturated compound preferably includes an ethylenically unsaturated compound including an acid group, from viewpoints of improving developability and improving wet heat resistance after applying salt water of the cured film.

Examples of the acid group include a phosphoric acid group, a sulfonic acid group, and a carboxyl group, and a carboxyl group is preferable.

Examples of the ethylenically unsaturated compound including the acid group include a tri- or tetra-functional ethylenically unsaturated compound including the acid group (component obtained by introducing a carboxyl group to pentaerythritol tri- and tetra-acrylate (PETA) skeleton (acid value=80 to 120 mgKOH/g)), and a penta- to hexa-functional ethylenically unsaturated compound including the acid group (component obtained by introducing a carboxyl group to dipentaerythritol penta- and hexa-acrylate (DPHA) skeleton (acid value=25 to 70 mgKOH/g)).

The tri- or higher functional ethylenically unsaturated compound including the acid group may be used in combination with the difunctional ethylenically unsaturated compound including the acid group, if necessary.

As the ethylenically unsaturated compound including the acid group, at least one kind selected from the group consisting of di- or higher functional ethylenically unsaturated compound including carboxyl group and a carboxylic acid anhydride thereof is preferable. Accordingly, the wet heat resistance after applying salt water of the cured film increases.

The di- or higher functional ethylenically unsaturated compound including a carboxyl group is not particularly limited and can be suitably selected from well-known compounds.

For example, as the di- or higher functional ethylenically unsaturated compound including a carboxyl group, ARONIX (registered trademark) TO-2349 (manufactured by Toagosei Co., Ltd.), ARONIX M-520 (manufactured by Toagosei Co., Ltd.), or ARONIX M-510 (manufactured by Toagosei Co., Ltd.) can be preferably used.

The ethylenically unsaturated compound including the acid group is also preferably a polymerizable compound including an acid group disclosed in paragraphs 0025 to 0030 of JP2004-239942A. The content of this publication is incorporated in this specification.

A weight-average molecular weight (Mw) of the ethylenically unsaturated compound used in the disclosure is preferably 200 to 3,000, more preferably 250 to 2,600, even more preferably 280 to 2,200, and particularly preferably 300 to 2,200.

A percentage of the content of the ethylenically unsaturated compound having a molecular weight equal to or smaller than 300, among the ethylenically unsaturated compound used in the photosensitive transparent resin layer is preferably 30% by mass, more preferably equal to or smaller than 25% by mass, and even more preferably equal to or smaller than 20% by mass, with respect to all of the ethylenically unsaturated compounds included in the photosensitive transparent resin layer.

The ethylenically unsaturated compound may be used alone or in combination of two or more kinds thereof.

The content of the ethylenically unsaturated compound in the photosensitive transparent resin layer is preferably 1% by mass to 70% by mass, more preferably 10% by mass to 70% by mass, even more preferably 20% by mass to 60% by mass, and particularly preferably 20% by mass to 50% by mass, with respect to a total mass of the photosensitive transparent resin layer.

In addition, in a case where the photosensitive transparent resin layer includes a difunctional ethylenically unsaturated compound and a tri- or higher functional ethylenically unsaturated compound, the content of the difunctional ethylenically unsaturated compound is preferably 10% by mass to 90% by mass, more preferably 20% by mass to 85% by mass, and even more preferably 30% by mass to 80% by mass, with respect to all of the ethylenically unsaturated compounds included in the photosensitive transparent resin layer.

In this case, the content of the tri- or higher functional ethylenically unsaturated compound is preferably 10% by mass to 90% by mass, more preferably 15% by mass to 80% by mass, and even more preferably 20% by mass to 70% by mass, with respect to all of the ethylenically unsaturated compounds included in the photosensitive transparent resin layer.

In this case, the content of the di- or higher functional ethylenically unsaturated compound is preferably equal to or greater than 40% by mass and smaller than 100% by mass, more preferably 40% by mass to 90% by mass, even more preferably 50% by mass to 80% by mass, and particularly preferably 50% by mass to 70% by mass, with respect to a total content of the difunctional ethylenically unsaturated compound and the tri- or higher functional ethylenically unsaturated compound.

In a case where the photosensitive transparent resin layer includes the di- or higher functional ethylenically unsaturated compound, the photosensitive transparent resin layer may further include a monofunctional ethylenically unsaturated compound.

In a case where the photosensitive transparent resin layer includes the di- or higher functional ethylenically unsaturated compound, the di- or higher functional ethylenically unsaturated compound is preferably a main component in the ethylenically unsaturated compound included in the photosensitive transparent resin layer.

Specifically, in a case where the photosensitive transparent resin layer includes di- or higher functional ethylenically unsaturated compound, the content of the di- or higher functional ethylenically unsaturated compound is preferably 60% by mass to 100% by mass, more preferably 80% by mass to 100% by mass, particularly preferably 90% by mass to 100% by mass with respect to a total content of the ethylenically unsaturated compound included in the photosensitive transparent resin layer.

In a case where the photosensitive transparent resin layer includes the ethylenically unsaturated compound including an acid group (preferably, di- or higher functional ethylenically unsaturated compound including a carboxyl group or a carboxylic acid anhydride thereof), the content of the ethylenically unsaturated compound including the acid group is preferably 1% by mass to 50% by mass, more preferably 1% by mass to 20% by mass, and even more preferably 1% by mass to 10% by mass, with respect to a total mass of the photosensitive transparent resin layer.

<<Photopolymerization Initiator>>

The photosensitive transparent resin layer of the transfer film according to the disclosure includes a photopolymerization initiator.

The photopolymerization initiator is not particularly limited and a well-known photopolymerization initiator can be used.

Examples of the photopolymerization initiator include a photopolymerization initiator having an oxime ester structure (hereinafter, also referred to as an "oxime-based photopolymerization initiator"), a photopolymerization initiator having an α-aminoalkylphenone structure (hereinafter, also referred to as an "α-aminoalkylphenone-based photopolymerization initiator"), a photopolymerization initiator having an α-hydroxyalkylphenone structure (hereinafter, also referred to as an "α-hydroxyalkylphenone-based photopolymerization initiator"), a photopolymerization initiator having an acylphosphine oxide structure (hereinafter, also referred to as an "acylphosphine oxide-based photopolymerization initiator"), and a photopolymerization initiator having an N-phenylglycine structure (hereinafter, also referred to as an "N-phenylglycine-based photopolymerization initiator").

The photopolymerization initiator preferably includes at least one kind selected from the group consisting of the oxime-based photopolymerization initiator, the α-aminoalkylphenone-based photopolymerization initiator, the α-hydroxyalkylphenone-based photopolymerization initiator, and the N-phenylglycine-based photopolymerization initiator, and more preferably includes at least one kind selected from the group consisting of the oxime-based photopolymerization initiator, the α-aminoalkylphenone-based photopolymerization initiator, and the N-phenylglycine-based photopolymerization initiator.

In addition, as the photopolymerization initiator, for example, polymerization initiators disclosed in paragraphs 0031 to 0042 of JP2011-095716A and paragraphs 0064 to 0081 of JP2015-014783A may be used.

Examples of a commercially available product of the photopolymerization initiator include 1-[4-(phenylthio)]-1, 2-octanedione-2-(O-benzoyloxime) (product name: IRGACURE (registered trademark) OXE-01, manufactured by BASF Japan Ltd.), 1-[9-ethyl-6-(2-methylbenzoyl)-9H-carbazol-3-yl]ethanone-1-(O-acetyloxime) (product name: IRGACURE OXE-02, manufactured by BASF Japan Ltd.), 2-(dimethylamino)-2-[(4-methylphenyl)methyl]-1-[4-(4-morpholinyl)phenyl]-1-butanone (product name: IRGACURE 379EQ manufactured by BASF Japan Ltd.), 2-methyl-1-(4-methylthiophenyl)-2-morpholinopropan-1-one (product name: IRGACURE 907, manufactured by BASF Japan Ltd.), 2-hydroxy-1-{4-[4-(2-hydroxy-2-methyl-propionyl)-benzyl]phenyl}-2-methyl-propan-1-one (product name: IRGACURE 127, manufactured by BASF Japan Ltd.), 2-benzyl-2-dimethylamino-1-(4-morpholinophenyl)-butanone-1 (product name: IRGACURE 369, manufactured by BASF Japan Ltd.), 2-hydroxy-2-methyl-1-phenyl-propan-1-one (product name: IRGACURE 1173, manufactured by BASF Japan Ltd.), 1-hydroxy cyclohexyl phenyl ketone (product name: IRGACURE 184, manufactured by BASF Japan Ltd.), 2,2-dimethoxy-1,2-diphenylethan-1-one (product name: IRGACURE 651, manufactured by BASF Japan Ltd.), and a product name of an oxime ester type (product name: Lunar 6, manufactured by DKSH Management Ltd.).

The photopolymerization initiator may be used alone or in combination of two or more kinds thereof.

A content of the photopolymerization initiator in the photosensitive transparent resin layer is not particularly limited, and is preferably equal to or greater than 0.1% by mass, more preferably equal to or greater than 0.5% by mass, and even more preferably equal to or greater than 1.0% by mass with respect to a total mass of the photosensitive transparent resin layer.

In addition, the content of the photopolymerization initiator is preferably equal to or smaller than 10% by mass and more preferably equal to or smaller than 5% by mass, with respect to a total mass of the photosensitive transparent resin layer.

<<Surfactant>>

The photosensitive transparent resin layer may include at least one kind of surfactant.

As the surfactant, surfactants disclosed in a paragraph 0017 of JP4502784B and paragraphs 0060 to 0071 of JP2009-237362A, a well-known fluorine surfactant, and the like can be used, for example.

As the surfactant, a fluorine surfactant is preferable.

As a commercially available product of the fluorine surfactant, MEGAFACE (registered trademark) F551 (manufactured by DIC Corporation) is used.

In a case where the photosensitive transparent resin layer includes the surfactant, a content of the surfactant is preferably 0.01% by mass to 3% by mass, more preferably 0.05% by mass to 1% by mass, and even more preferably 0.1% by mass to 0.8% by mass with respect to a total mass of the photosensitive transparent resin layer.

<<Polymerization Inhibitor>>

The photosensitive transparent resin layer may include at least one kind of the polymerization inhibitor.

As the polymerization inhibitor, a thermal polymerization inhibitor (also referred to as a polymerization inhibitor) disclosed in a paragraph 0018 of JP4502784B can be used.

Among these, phenothiazine, phenoxazine, or 4-methoxyphenol can be suitably used.

In a case where the photosensitive transparent resin layer includes the polymerization inhibitor, a content of the polymerization inhibitor is preferably 0.01% by mass to 3% by mass, more preferably 0.01% by mass to 1% by mass, and even more preferably 0.01% by mass to 0.8% by mass with respect to a total mass of the photosensitive transparent resin layer.

<<Other Components>>

The photosensitive transparent resin layer may include a component other than the components described above.

Examples of the other components include a thermal polymerization inhibitor disclosed in a paragraph 0018 of JP4502784B, and other additives disclosed in paragraphs 0058 to 0071 of JP2000-310706.

The photosensitive transparent resin layer may include at least one kind of particles (for example, metal oxide particles) as the other component, in order to adjust a refractive index or light transmittance.

The metal of the metal oxide particles also includes semimetal such as B, Si, Ge, As, Sb, or Te. From a viewpoint of transparency of the cured film, an average primary particle diameter of the particles (for example, metal oxide particles) is preferably 1 to 200 nm and more preferably 3 to 80 nm. The average primary particle diameter is calculated by measuring particle diameters of 200 random particles using an electron microscope and averaging the measured result. In a case where the shape of the particle is not a spherical shape, the longest side is set as the particle diameter.

The content of the particles is preferably 0% by mass to 35% by mass, more preferably 0% by mass to 10% by mass, even more preferably 0% by mass to 5% by mass, still more preferably 0% by mass to 1% by mass, and particularly preferably 0% by mass (that is, the photosensitive transparent resin layer includes no particles), with respect to a total mass of the photosensitive transparent resin layer.

In addition, the photosensitive transparent resin layer may include a small amount of colorant (pigment, dye, and the like) as the other component, but it is preferable that a colorant is not substantially included, from a viewpoint of transparency.

Specifically, a content of the colorant in the photosensitive transparent resin layer is preferably smaller than 1% by mass and more preferably smaller than 0.1% by mass with respect to a total mass of the photosensitive transparent resin layer.

A thickness of the photosensitive transparent resin layer is preferably equal to or smaller than 20 μm, more preferably equal to or smaller than 15 μm, and particularly preferably equal to or smaller than 12 μm. In a case where the thickness of the photosensitive transparent resin layer is equal to or smaller than 20 μm, it is advantageous from viewpoints of thinning of the entire transfer film, improvement of transmittance of the photosensitive transparent resin layer or the cured film to be obtained, and the prevention of the photosensitive transparent resin layer or the cured film to be obtained being stained into yellow.

In general, in a case where the thickness of the photosensitive transparent resin layer is equal to or smaller than 20 μm, the wet heat resistance after applying salt water of the cured film may be deteriorated. However, in the photosensitive transparent resin layer of the transfer film according to the disclosure, even in a case where the thickness of the photosensitive transparent resin layer is equal to or smaller than 20 μm, a deterioration in wet heat resistance after applying salt water of the cured film due to a decrease in thickness can be prevented.

The thickness of the photosensitive transparent resin layer is preferably equal to or greater than 1 μm, more preferably equal to or greater than 2 μm, and particularly preferably equal to or greater than 3 μm, from a viewpoint of manufacturing suitability.

A refractive index of the photosensitive transparent resin layer is preferably 1.47 to 1.56, more preferably 1.50 to 1.53, even more preferably 1.50 to 1.52, and particularly preferably 1.51 to 1.52.

In the disclosure, the "refractive index" indicates a refractive index at a wavelength of 550 nm.

The "refractive index" in the disclosure means a value measured with visible light at a wavelength of 550 nm at a temperature of 23° C. by ellipsometry, unless otherwise noted.

A forming method of the photosensitive transparent resin layer is not particularly limited.

As an example of the forming method of the photosensitive transparent resin layer, a method of forming the photosensitive transparent resin layer by applying and, if necessary, drying the photosensitive resin composition including the solvent, on the temporary support is used.

As the coating method, a well-known method can be used, and examples thereof include a printing method, a spraying method, a roll coating method, a bar coating method, a curtain coating method, a spin coating method, and a die coating method (that is, slit coating method), and a die coating method is preferable.

As the drying method, a well-known method such as natural drying, heating drying, and drying under reduced pressure can be applied alone or in combination of plural thereof.

—Solvent—

In the formation of the photosensitive transparent resin layer, at least one kind of solvent may be included, from a viewpoint of forming the photosensitive transparent resin layer by coating.

As the solvent, a solvent normally used can be used without particular limitations.

The solvent is preferably an organic solvent.

Examples of the organic solvent include methyl ethyl ketone, propylene glycol monomethyl ether, propylene glycol monomethyl ether acetate (another name: 1-methoxy-2-propyl acetate), diethylene glycol ethyl methyl ether, cyclohexanone, methyl isobutyl ketone, ethyl lactate, methyl lactate, caprolactam, n-propanol, and 2-propanol. The solvent used may include a mixed solvent which is a mixture of these compounds.

As the solvent, a mixed solvent of methyl ethyl ketone and propylene glycol monomethyl ether acetate, or a mixed solvent of diethylene glycol ethyl methyl ether and propylene glycol monomethyl ether acetate is preferable.

In a case of using the solvent, a content of solid contents of the photosensitive resin composition is preferably 5% by mass to 80% by mass, more preferably 5% by mass to 40% by mass, and particularly preferably 5% by mass to 30% by mass with respect to a total amount of the photosensitive resin composition.

In a case of using the solvent, a viscosity (25° C.) of the photosensitive resin composition is preferably 1 mPa·s to 50 mPa·s, more preferably 2 mPa·s to 40 mPa·s, and particularly preferably 3 mPa·s to 30 mPa·s, from a viewpoint of coating properties.

The viscosity is, for example, measured using VISCOMETER TV-22 (manufactured by Toki Sangyo Co. Ltd.).

In a case where the photosensitive resin composition includes the solvent, a surface tension (25° C.) of the photosensitive resin composition is preferably 5 mN/m to 100 mN/m, more preferably 10 mN/m to 80 mN/m, and particularly preferably 15 mN/m to 40 mN/m, from a viewpoint of coating properties.

The surface tension is, for example, measured using Automatic Surface Tensiometer CBVP-Z (manufactured by Kyowa Interface Science Co., Ltd.).

As the solvent, a solvent disclosed in paragraphs 0054 and 0055 of US2005/282073A1 can also be used, and the content of this specification is incorporated in the present specification.

In addition, as the solvent, an organic solvent (high-boiling-point solvent) having a boiling point of 180° C. to 250° C. can also be used, if necessary.

<Temporary Support>

The transfer film according to the disclosure includes a temporary support.

The temporary support is preferably a film and more preferably a resin film.

As the temporary support, a film which has flexibility and does not generate significant deformation, shrinkage, or stretching under the pressure or under pressure and heating can be used.

Examples of such a film include a polyethylene terephthalate film, a cellulose triacetate film, a polystyrene film, a polyimide film, and a polycarbonate film.

Among these, a biaxial stretching polyethylene terephthalate film is particularly preferable.

It is preferable that the film used as the temporary support does not have deformation such as wrinkles or scratches.

A thickness of the temporary support is not particularly limited, and is, for example, preferably 5 µm to 200 µm, and is particularly preferably 10 µm to 150 µm, from viewpoints of ease of handling and general-purpose properties.

<Second Transparent Resin Layer>

The transfer film according to the disclosure may further include a second transparent resin layer on a side opposite to a side where the temporary support is present, seen from the photosensitive transparent resin layer (for example, see specific example of the transfer film which will be described later).

As the second transparent resin layer, a refractive index adjusting layer is preferably used.

According to the transfer film of the aspect including the refractive index adjusting layer, in a case of forming a protective layer for a touch panel by transferring the refractive index adjusting layer and the photosensitive transparent resin layer of the transfer film to a substrate for a touch panel including a transparent electrode pattern, the transparent electrode pattern is more hardly recognized (that is, concealing properties of the transparent electrode pattern are further improved). A phenomenon that the transparent electrode pattern is recognized, is generally referred to as "see-through".

Regarding the phenomenon that the transparent electrode pattern is recognized, and the concealing properties of the transparent electrode pattern, JP2014-010814A and JP2014-108541A can be suitably referred to.

The second transparent resin layer is preferably disposed to be adjacent to the photosensitive transparent resin layer.

The refractive index of the second transparent resin layer is preferably higher than the refractive index of the photosensitive transparent resin layer, from a viewpoint of preventing the see-through.

The refractive index of the second transparent resin layer preferably equal to or greater than 1.50, more preferably equal to or greater than 1.55, and particularly preferably equal to or greater than 1.60.

An upper limit of the refractive index of the second transparent resin layer is not particularly limited, and is preferably equal to or smaller than 2.10, more preferably equal to or smaller than 1.85, even more preferably equal to or smaller than 1.78, and particularly preferably equal to or smaller than 1.74.

The second transparent resin layer may have photocuring properties (that is, photosensitivity), may have thermosetting properties, or may have both photocuring properties and thermosetting properties.

From a viewpoint of forming the cured film having excellent hardness by the photocuring after the transfer, the second transparent resin layer preferably has photocuring properties.

From viewpoints of further improving hardness of the cured film and further improving wet heat resistance after applying salt water of the cured film by the heat curing, the second transparent resin layer preferably has thermosetting properties.

The second transparent resin layer preferably has thermosetting properties and photocuring properties.

The second transparent resin layer preferably has alkali solubility (for example, solubility with respect to weak alkali aqueous solution).

The aspect in which the second transparent resin layer has photosensitivity, has an advantage, from a viewpoint of collectively patterning the photosensitive transparent resin layer and the second transparent resin layer transferred onto the substrate by photolithography at one time, after the transferring.

A film thickness of the second transparent resin layer is preferably equal to or smaller than 500 nm, more preferably equal to or smaller than 110 nm, and particularly preferably equal to or smaller than 100 nm.

In addition, the film thickness of the second transparent resin layer is preferably equal to or greater than 20 nm, more preferably equal to or greater than 50 nm, even more preferably equal to or greater than 55 nm, and particularly preferably equal to or greater than 60 nm.

The refractive index of the second transparent resin layer is preferably adjusted in accordance with the refractive index of the transparent electrode pattern.

In a case where the refractive index of the transparent electrode pattern is 1.8 to 2.0, as in a case of the transparent electrode pattern formed of ITO, the refractive index of the second transparent resin layer is preferably equal to or greater than 1.60. An upper limit of the refractive index of the second transparent resin layer in this case is not particularly limited, and is preferably equal to or smaller than 2.1, more preferably equal to or smaller than 1.85, even more preferably equal to or smaller than 1.78, and particularly preferably equal to or smaller than 1.74.

In addition, in a case where the refractive index of the transparent electrode pattern is greater than 2.0, as in a case of the transparent electrode pattern formed of indium zinc oxide (IZO), for example, the refractive index of the second transparent resin layer is preferably 1.70 to 1.85.

A method of controlling the refractive index of the second transparent resin layer is not particularly limited, and examples thereof include a method using a resin having a predetermined refractive index alone, a method using a resin and metal oxide particles and metal particles, and a method using a composite of metal salt and a resin.

The second transparent resin layer preferably includes at least one kind selected from the group consisting of inorganic particles having a refractive index equal to or greater than 1.50 (more preferably equal to or greater than 1.55, and particularly preferably equal to or greater than 1.60), a resin having a refractive index equal to or greater than 1.50 (more preferably equal to or greater than 1.55, and particularly preferably equal to or greater than 1.60), and a polymerizable monomer having a refractive index equal to or greater than 1.50 (more preferably equal to or greater than 1.55, and particularly preferably equal to or greater than 1.60).

According to this aspect, the refractive index of the second transparent resin layer is easily adjusted to be equal to or greater than 1.50 (more preferably equal to or greater than 1.55, and particularly preferably equal to or greater than 1.60).

The second transparent resin layer preferably includes a binder polymer, an ethylenically unsaturated compound, and particles.

Regarding the components of the second transparent resin layer, components of a curable transparent resin layer disclosed in paragraphs 0019 to 0040 and 0144 to 0150 of JP2014-108541A, and components of a transparent layer disclosed in paragraphs 0024 to 0035 and 0110 to 0112 of JP2014-010814A, and components of a composition including ammonium salt disclosed in paragraphs 0034 to 0056 of WO2016/009980 can be referred to.

In addition, the second transparent resin layer preferably includes at least one kind of a metal oxide suppressing agent.

In a case where the second transparent resin layer includes the metal oxide suppressing agent, surface treatment can be performed with respect to a member (for example, conductive member formed on a substrate) in a direct contact with the second transparent resin layer, in a case of transferring the second transparent resin layer onto the substrate (that is, a target to be transferred). This surface treatment applies a metal oxide suppressing function (protection properties) with respect to the member in a direct contact with the second transparent resin layer.

The metal oxide suppressing agent is preferably a compound having an aromatic ring including nitrogen atoms. The compound having an aromatic ring including nitrogen atoms may include a substituent.

The aromatic ring including nitrogen atoms is preferably an imidazole ring, a triazole ring, a tetrazole ring, a thiazole ring, a thiadiazole ring, or a fused ring of any one thereof and another aromatic ring, and more preferably an imidazole ring, a triazole ring, a tetrazole ring, or a fused ring of any one thereof and another aromatic ring.

The "another aromatic ring" forming the fused ring may be a homocyclic ring or a heterocyclic ring, and is preferably a homocyclic ring, more preferably a benzene ring or a naphthalene ring, and even more preferably a benzene ring.

As the metal oxide suppressing agent, imidazole, benzimidazole, tetrazole, 5-amino-1H-tetrazole, mercaptothiadiazole, 1,2,4-triazole, or benzotriazole is preferable, and imidazole, benzimidazole, 5-amino-1H-tetrazole, 1,2,4-triazole, or benzotriazole is more preferable.

As the metal oxide suppressing agent, a commercially available product may be used, and as the commercially available product, BT 120 manufactured by Johoku Chemical Co., Ltd. including benzotriazole can be preferably used, for example.

In a case where the second transparent resin layer includes the metal oxide suppressing agent, a content of the metal oxide suppressing agent is preferably 0.1% by mass to 20% by mass, more preferably 0.5% by mass to 10% by mass, and even more preferably 1% by mass to 5% by mass with respect to a total mass of the second transparent resin layer.

The second transparent resin layer may include a component other than the component described above.

The other component which can be included in the second transparent resin layer is the same as the other component which can be included in the photosensitive transparent resin layer described above.

The second transparent resin layer preferably includes a surfactant as the other component.

A forming method of the second transparent resin layer is not particularly limited.

As an example of the forming method of the second transparent resin layer, a method of forming the layer by applying and, if necessary, drying a composition for forming a second transparent resin layer of the aspect including an aqueous solvent, on the photosensitive transparent resin layer formed on the temporary support is used.

Specific examples of the coating and drying method are respectively the same as the specific examples of the coating and drying in a case of forming the photosensitive transparent resin layer.

The composition for forming the second transparent resin layer can include each component of the second transparent resin layer described above.

The composition for forming the second transparent resin layer, for example, includes a binder polymer, an ethylenically unsaturated compound, particles, and an aqueous solvent.

In addition, as the composition for forming the second transparent resin layer, a composition including ammonium salt disclosed in paragraphs 0034 to 0056 of WO2016/009980 is also preferable.

<Protective Film>

The transfer film according to the disclosure may further include a protective film on a side of the photosensitive transparent resin layer opposite to the temporary support.

In a case where the transfer film according to the disclosure includes the second transparent resin layer on a side of the photosensitive transparent resin layer opposite to the temporary support, the protective film is preferably disposed on a side of the second transparent resin layer opposite to the temporary support.

Examples of the protective film include a polyethylene terephthalate film, a polypropylene film, a polystyrene film, and a polycarbonate film.

As the protective film, a component disclosed in paragraphs 0083 to 0087 and 0093 of JP2006-259138A may be used, for example.

<Thermoplastic Resin Layer>

The transfer film according to the disclosure may further include a thermoplastic resin layer between a temporary support and a photosensitive transparent resin layer.

In a case where the transfer film includes the thermoplastic resin layer and the transfer film is transferred to a substrate to form a laminate, air bubbles are hardly generated on each component of the laminate. In a case where this laminate is used in an image display apparatus, image unevenness is hardly generated and excellent display properties are obtained.

The thermoplastic resin layer preferably has alkali solubility.

The thermoplastic resin layer functions as a cushion material which absorbs ruggedness of the surface of the substrate at the time of transfer.

The ruggedness of the surface of the substrate includes an image, an electrode, a wiring, and the like which are formed in advance. The thermoplastic resin layer preferably has properties capable of being deformed in accordance with ruggedness.

The thermoplastic resin layer preferably includes an organic polymer substance disclosed in JP1993-072724A (JP-H5-072724A), and more preferably includes an organic polymer substance having a softening point approximately equal to or lower than 80° C. by a Vicat method (specifically, polymer softening point measurement method using a American Society for Testing and Materials ASTM D1235).

A thickness of the thermoplastic resin layer is preferably 3 μm to 30 μm, more preferably 4 μm to 25 μm, and even more preferably 5 μm to 20 μm.

In a case where the thickness of the thermoplastic resin layer is equal to or greater than 3 μm, followability with respect to the ruggedness of the surface of the substrate is improved, and accordingly, the ruggedness of the surface of the substrate can be effectively absorbed.

In a case where the thickness of the thermoplastic resin layer is equal to or smaller than 30 μm, process suitability is further improved. For example, burden of the drying (solvent removal) in a case of applying and forming the thermoplastic resin layer on the temporary support is further reduced, and the development time of the thermoplastic resin layer after the transfer is shortened.

The thermoplastic resin layer can be formed by applying and, if necessary, drying a composition for forming a thermoplastic resin layer including a solvent and a thermoplastic organic polymer on the temporary support.

Specific examples of the coating and drying method are respectively the same as the specific examples of the coating and drying in a case of forming the photosensitive transparent resin layer.

The solvent is not particularly limited, as long as a polymer component forming the thermoplastic resin layer is dissolved, and examples thereof include organic solvents (for example, methyl ethyl ketone, cyclohexanone, propylene glycol monomethyl ether acetate, n-propanol, and 2-propanol).

A viscosity of the thermoplastic resin layer measured at 100° C. is preferably 1,000 to 10,000 Pa·s. In addition, the viscosity of the thermoplastic resin layer measured at 100° C. is preferably lower than the viscosity of the photosensitive transparent resin layer measured at 100° C.

<Interlayer>

The transfer film according to the disclosure may further include an interlayer between the temporary support and the photosensitive transparent resin layer.

In a case where the transfer film according to the disclosure includes the thermoplastic resin layer, the interlayer is preferably disposed between the thermoplastic resin layer and the photosensitive transparent resin layer.

As the component of the interlayer, a resin which is a mixture including polyvinyl alcohol, polyvinyl pyrrolidone, cellulose, or at least two kinds thereof.

In addition, as the interlayer, a component disclosed in JP1993-072724A (JP-H5-072724A) as a "separation layer" can also be used.

In a case of manufacturing the transfer film of the aspect including the thermoplastic resin layer, the interlayer, and the photosensitive transparent resin layer on the temporary support in this order, the interlayer can be, for example, formed by applying and, if necessary, drying a composition for forming an interlayer including a solvent which does not dissolve the thermoplastic resin layer, and the resin as the component of the interlayer. Specific examples of the coating and drying method are respectively the same as the specific examples of the coating and drying in a case of forming the photosensitive transparent resin layer.

In this case, for example, first, the composition for forming a thermoplastic resin layer is applied and dried on the temporary support to form the thermoplastic resin layer. Next, the composition for forming an interlayer is applied and dried on this thermoplastic resin layer to form the interlayer. After that, the photosensitive resin composition of the aspect including the organic solvent is applied and dried on the interlayer to form the photosensitive transparent resin layer. The organic solvent in this case is preferably an organic solvent which does not dissolve the interlayer.

<Specific Example of Transfer Film>

FIG. 1 is a schematic cross sectional view showing a transfer film 10 which is a specific example of the transfer film according to the disclosure.

As shown in FIG. 1, the transfer film 10 has a laminated structure of protective film 16/second transparent resin layer 20A/photosensitive transparent resin layer 18A/temporary support 12 (that is, laminated structure in which a temporary support 12, a photosensitive transparent resin layer 18A, a second transparent resin layer 20A, and a protective film 16 are laminated in this order).

However, the transfer film according to the disclosure is not limited to the transfer film 10, and the second transparent resin layer 20A and the protective film 16 may be omitted, for example. In addition, at least one of the thermoplastic resin layer or the interlayer described above may be included between the temporary support 12 and the photosensitive transparent resin layer 18A.

The second transparent resin layer 20A is a layer disposed on a side of the photosensitive transparent resin layer 18A opposite to the side where the temporary support 12 is present, and a layer having a refractive index at a wavelength of 550 nm equal to or greater than 1.50.

The transfer film 10 is a negative type material (negative type film).

A manufacturing method of the transfer film 10 is not particularly limited.

The manufacturing method of the transfer film 10, for example, includes a step of forming the photosensitive transparent resin layer 18A on the temporary support 12, a step of forming the second transparent resin layer 20A on the photosensitive transparent resin layer 18A, and a step of forming the protective film 16 on the second transparent resin layer 20A in this order.

The manufacturing method of the transfer film 10 may include a step of volatilizing ammonia disclosed in a paragraph 0056 of WO2016/009980, between the step of forming the second transparent resin layer 20A and the step of forming the protective film 16.

(Electrode Protective Film, Laminate, and Capacitive Input Device)

The electrode protective film according to the disclosure is an electrode protective film in which the temporary support is removed from the transfer film according to the disclosure.

The electrode protective film according to the disclosure is preferably an electrode protective film of the capacitive input device and more preferably an electrode protective film for a touch panel.

The laminate according to the disclosure described below includes the electrode protective film according to the disclosure.

The laminate according to the disclosure includes a photosensitive transparent resin layer after removing a temporary support from the transfer film according to the disclosure, on a substrate including an electrode of a capacitive input device, in order from the substrate side.

In addition, the laminate according to the disclosure preferably includes a second transparent resin layer after removing a temporary support from the transfer film according to the disclosure, and a photosensitive transparent resin layer, on a substrate including an electrode of a capacitive input device, in order from the substrate side.

The capacitive input device according to the disclosure includes the electrode protective film according to the disclosure or the laminate according to the disclosure.

The electrode of the capacitive input device may be a transparent electrode pattern or a leading wiring. In the laminate, the electrode of the capacitive input device is preferably an electrode pattern and more preferably a transparent electrode pattern.

It is preferable that the laminate according to the disclosure includes a substrate, a transparent electrode pattern, a second transparent resin layer disposed to be adjacent to the transparent electrode pattern, and a photosensitive transparent resin layer disposed to be adjacent to the second transparent resin layer, and a refractive index of the second transparent resin layer is higher than a refractive index of the photosensitive transparent resin layer. The refractive index of the second transparent resin layer is preferably equal to or greater than 1.6.

By using the configuration of the laminate described above, concealing properties of the transparent electrode pattern are improved.

As the substrate, a glass substrate or a resin substrate is preferable.

In addition, the substrate is preferably a transparent substrate and more preferably a transparent resin substrate. The meaning of the transparency is as described above.

A refractive index of the substrate is preferably 1.50 to 1.52.

As the glass substrate, tempered glass such as GORILLA GLASS (registered trademark) manufactured by Corning Incorporated can be used.

As the resin substrate, at least one of a component without optical strains or a component having high transparency is preferably used, and a substrate formed of a resin such as polyethylene terephthalate (PET), polyethylene naphthalate (PEN), polycarbonate (PC), triacetyl cellulose (TAC), polyimide (PI), polybenzoxazole (PBO), or cycloolefin polymer (COP) is used, for example.

As a material of the transparent substrate, a material disclosed in JP2010-086684A, JP2010-152809A, and JP2010-257492A is preferably used.

As the capacitive input device, a touch panel is suitably used.

As the electrode for a touch panel, a transparent electrode pattern disposed at least in an image display region of the touch panel is used. The electrode for a touch panel may extend from the image display region to a frame portion of the touch panel.

As the wiring for a touch panel, a leading wiring (lead-out wiring) disposed on the frame portion of the touch panel is used, for example.

As a preferred aspect of the substrate for a touch panel and the touch panel, an aspect in which the transparent electrode pattern and the leading wiring are electrically connected to each other by laminating a part of the leading wiring on a portion of the transparent electrode pattern extending to the frame portion of the touch panel, is suitable.

As a material of the transparent electrode pattern, a metal oxide film of indium tin oxide (ITO) and indium zinc oxide (IZO) is preferable.

As a material of the leading wiring, metal is preferable. Examples of the metal which is the material of the leading wiring include gold, silver, copper, molybdenum, aluminum, titanium, chromium, zinc, and manganese, and alloy formed of two or more kinds of these metal elements. As the material of the leading wiring, copper, molybdenum, aluminum, or titanium is preferable, copper is particularly preferable.

The electrode protective film for a touch panel according to the disclosure is provided so as to cover the electrode and the like directly or through other layers, in order to protect the electrode and the like (that is, at least one of the electrode for a touch panel and the wiring for a touch panel).

The preferred range of a thickness of the electrode protective film for a touch panel is the same as the preferred range of a thickness of the photosensitive transparent resin layer described above.

The electrode protective film according to the disclosure, preferably the electrode protective film for a touch panel may include an opening.

The opening can be formed by dissolving an unexposed portion of the photosensitive transparent resin layer with a developer.

In this case, in a case where the electrode protective film for a touch panel is formed under the laminating condition at a high temperature using the transfer film, the development residue of the opening of the electrode protective film for a touch panel is prevented.

The touch panel may further include a first refractive index adjusting layer between the electrode and the like and the electrode protective film for a touch panel (for example, see first specific example of the touch panel which will be described later).

The preferred aspect of the first refractive index adjusting layer is the same as the preferred aspect of the second transparent resin layer included in the transfer film. The first refractive index adjusting layer may be formed by applying and drying a composition for forming the first refractive index adjusting layer, or may be formed by transferring the refractive index adjusting layer of the transfer film including the refractive index adjusting layer.

The touch panel of the aspect including the first refractive index adjusting layer is preferably formed by transferring the photosensitive transparent resin layer and the second transparent resin layer of the transfer film by using the transfer film according to the disclosure of the aspect including the second transparent resin layer. In this case, the electrode protective layer for a touch panel is formed of the photosensitive transparent resin layer of the transfer film, and the first refractive index adjusting layer is formed of the second transparent resin layer of the transfer film.

In addition, the touch panel or the substrate for a touch panel may include a second refractive index adjusting layer between the substrate and the electrode and the like (for example, see, first specific example of the touch panel which will be described later).

The preferred aspect of the second refractive index adjusting layer is the same as the preferred aspect of the second transparent resin layer included in the transfer film.

The aspect in which the touch panel of the disclosure includes the first refractive index adjusting layer (more preferably, aspect of including the first refractive index adjusting layer and the second refractive index adjusting layer) has an advantage in which the electrode and the like is hardly recognized (that is, so-called see-through is prevented).

Regarding the structure of the touch panel, a structure of a capacitive input device disclosed in JP2014-010814A or JP2014-108541A may be referred to.

<First Specific Example of Touch Panel>

Figure 2:
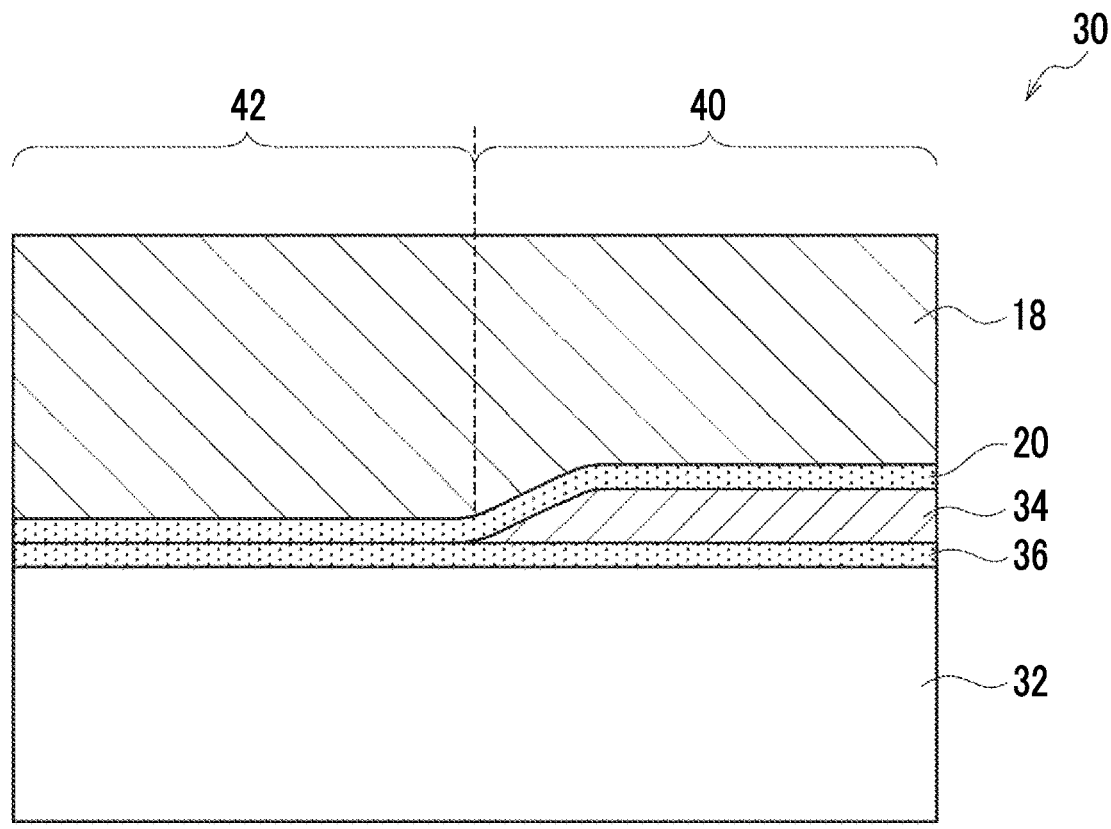
FIG. 2 is a schematic cross sectional view showing a first specific example of a touch panel according to the disclosure.

FIG. 2 is a schematic cross sectional view of a touch panel 30 which is the first specific example of the touch panel according to the disclosure. More specifically, FIG. 2 is a schematic cross sectional view of an image display region of the touch panel 30.

As shown in FIG. 2, the touch panel 30 has a structure in which a substrate 32, a second refractive index adjusting layer 36, a transparent electrode pattern 34 as the electrode for a touch panel, a first refractive index adjusting layer 20, and an electrode protective film 18 for a touch panel are disposed in this order.

In the touch panel 30, the electrode protective film 18 for a touch panel and the first refractive index adjusting layer 20 cover the entire transparent electrode pattern 34. However, the touch panel according to the disclosure is not limited to this aspect. The electrode protective film 18 for a touch panel and the first refractive index adjusting layer 20 may cover at least a portion of the transparent electrode pattern 34.

In addition, the second refractive index adjusting layer 36 and the first refractive index adjusting layer 20 are preferably respectively continuously coated over a first region 40 in which the transparent electrode pattern 34 is present and a second region 42 in which the transparent electrode pattern 34 is not present directly or through another layer. Accordingly, the transparent electrode pattern 34 is more hardly recognized.

The second refractive index adjusting layer 36 and the first refractive index adjusting layer 20 are preferably coated directly over both of the first region 40 and the second region 42, rather than the coating through the other layer. Examples of the "other layer" include an insulating layer and an electrode pattern other than the transparent electrode pattern 34.

The first refractive index adjusting layer 20 is laminated over both of the first region 40 and the second region 42. The first refractive index adjusting layer 20 is adjacent to the second refractive index adjusting layer 36 and is also adjacent to the transparent electrode pattern 34.

In a case where the shape of the end portion of the transparent electrode pattern 34 at a portion in contact with the second refractive index adjusting layer 36 is a tapered shape as shown in FIG. 2, the first refractive index adjusting layer 20 is preferably laminated along the tapered shape (that is, at the same tilt as the taper angle).

As the transparent electrode pattern 34, the ITO transparent electrode pattern is suitable.

The transparent electrode pattern 34 can be, for example, formed by the following method.

A thin film for an electrode (for example, ITO film) is formed on the substrate 32 on which the second refractive index adjusting layer 36 is formed by sputtering. By applying a photosensitive resist for etching or transferring a photosensitive film for etching onto the thin film for an electrode, an etching protective layer is formed. Then, this etching protective layer is patterned in a desired pattern shape by exposure and development. Next, a portion of the thin film for an electrode which is not covered with the patterned etching protective layer is removed by etching. Accordingly, the thin film for an electrode is set to have a pattern having a desired shape (that is, transparent electrode pattern 34). Then, the patterned etching protective layer is removed by a peeling solution.

The first refractive index adjusting layer 20 and the electrode protective film 18 for a touch panel are, for example, formed on the substrate 32 (that is, substrate for a touch panel) on which the second refractive index adjusting layer 36 and the transparent electrode pattern 34 are provided in order, as described below.

First, the transfer film 10 (that is, transfer film 10 having a laminated structure of protective film 16/second transparent resin layer 20A/photosensitive transparent resin layer 18A/temporary support 12) shown in FIG. 1 is prepared.

Next, the protective film 16 is removed from the transfer film 10.

Then, the transfer film 10, from which the protective film 16 is removed, is laminated on the substrate 32 (that is, substrate for a touch panel) on which the second refractive index adjusting layer 36 and the transparent electrode pattern 34 are provided in order. The laminating is performed in a direction in which the second transparent resin layer 20A of the transfer film 10, from which the protective film 16 is removed, and the transparent electrode pattern 34 are in contact with each other. By this laminating, a laminate having a laminated structure of temporary support 12/photosensitive transparent resin layer 18A/second transparent resin layer 20A/transparent electrode pattern 34/second refractive index adjusting layer 36/substrate 32 is obtained.

Next, the temporary support 12 is removed from the laminate.

Then, by performing the pattern exposure with respect to the laminate, from which the temporary support 12 is removed, the photosensitive transparent resin layer 18A and the second transparent resin layer 20A are cured in a pattern shape. The curing of the photosensitive transparent resin layer 18A and the second transparent resin layer 20A in a pattern shape may be respectively individually performed by individual pattern exposure, but the curing is preferably performed at the same time by the pattern exposure at one time.

Next, by removing the unexposed portion (that is, uncured portion) of the photosensitive transparent resin layer 18A and the second transparent resin layer 20A by the development, the electrode protective film 18 for a touch panel which is a patterned cured product of the photosensitive transparent resin layer 18A (not shown regarding the pattern shape), and the first refractive index adjusting layer 20 which is a patterned cured product of the second transparent resin layer 20A (not shown regarding the pattern shape) are respectively obtained. The development of the photosensitive transparent resin layer 18A and the second transparent resin layer 20A after the pattern exposure may be respectively individually performed by individual development, but the development is preferably performed at the same time by the development at one time.

The preferred aspects of the laminating, the pattern exposure, and the development will be described later.

Regarding the structure of the touch panel, a structure of a capacitive input device disclosed in JP2014-010814A or JP2014-108541A may be referred to.

<Second Specific Example of Touch Panel>

Figure 3:
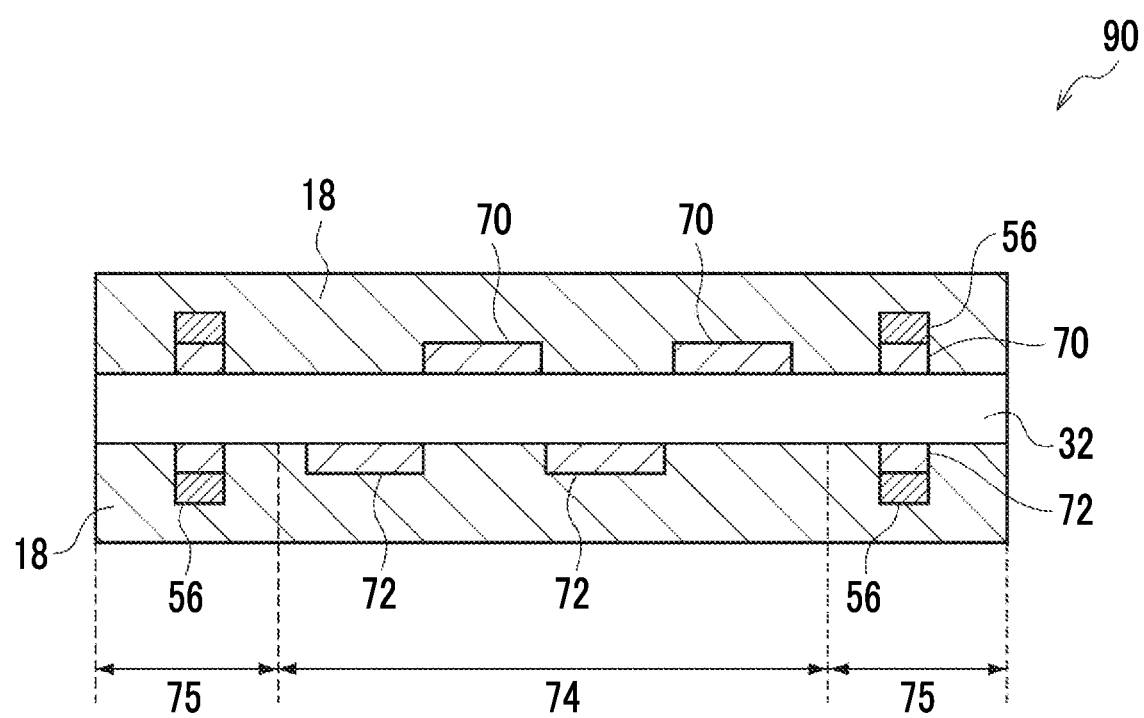
FIG. 3 is a schematic cross sectional view showing a second specific example of the touch panel according to the disclosure.

FIG. 3 is a schematic cross sectional view of a touch panel 90 which is a second specific example of the touch panel according to the disclosure.

As shown in FIG. 3, the touch panel 90 includes an image display region 74 and an image non-display region 75 (that is, frame portion).

As shown in FIG. 3, the touch panel 90 includes the electrode for a touch panel on both surfaces of the substrate 32. Specifically, the touch panel 90 includes a first transparent electrode pattern 70 on one surface of the substrate 32 and includes a second transparent electrode pattern 72 on the other surface thereof.

In the touch panel 90, a leading wiring 56 is connected to the first transparent electrode pattern 70 and the second transparent electrode pattern 72, respectively. The leading wiring 56 is, for example, a copper wiring.

In the touch panel 90, the electrode protective film 18 for a touch panel is formed on one surface of the substrate 32 so as to cover the first transparent electrode pattern 70 and the leading wiring 56, and the electrode protective film 18 for a touch panel is formed on the other surface of the substrate 32 so as to cover the second transparent electrode pattern 72 and the leading wiring 56.

The first refractive index adjusting layer and the second refractive index adjusting layer of the first specific example may be provided on the one surface and the other surface of the substrate 32, respectively.

<Manufacturing Method of Touch Panel>

The method of manufacturing the touch panel according to the disclosure is not particularly limited, and the following manufacturing method is preferable.

The preferred manufacturing method of the touch panel according to the disclosure includes a step of preparing a substrate for a touch panel having a structure in which the electrode and the like (that is, at least one of the electrode for a touch panel and the wiring for a touch panel) are disposed on a substrate (hereinafter, also referred to as a "preparation step"), a step of forming a photosensitive transparent resin layer on a surface of the substrate for a touch panel on a side where the electrode and the like are disposed, using the transfer film according to the disclosure (hereinafter, also referred to as a "photosensitive transparent resin layer forming step"), a step of performing pattern exposure with respect to the photosensitive transparent resin layer formed on the surface of the substrate for a touch panel (hereinafter, also referred to as a "pattern exposure step"), and a step of a developing the pattern-exposed photosensitive transparent resin layer to obtain an electrode protective film for a touch panel which protects at least a portion of the electrode and the like (hereinafter, also referred to as a "development step").

According to the preferred manufacturing method, a touch panel including the electrode protective film for a touch panel having excellent perspiration resistance (wet heat resistance after applying salt water) can be manufactured.

In addition, in the preferred manufacturing method, even in a case where the photosensitive transparent resin layer is formed under the laminating condition at a high temperature using the transfer film according to the disclosure, the occurrence of the development residue is prevented in the unexposed portion of the photosensitive transparent resin layer after the development.

Hereinafter, each step of the preferred manufacturing method will be described.

<Preparation Step>

The preparation step is a step for convenience, and is a step of preparing a substrate for a touch panel having a structure in which the electrode and the like (that is, at least one of the electrode for a touch panel and the wiring for a touch panel) are disposed on a substrate.

The preparation step may be a step of only simply preparing the substrate for a touch panel manufactured in advance, or may be a step of manufacturing the substrate for a touch panel.

The preferred aspect of the substrate for a touch panel is as described above.

<Photosensitive Transparent Resin Layer Forming Step>

The photosensitive transparent resin layer forming step is a step of forming a photosensitive transparent resin layer on a surface of the substrate for a touch panel on a side where the electrode and the like are disposed, using the transfer film according to the disclosure.

Hereinafter, in the photosensitive transparent resin layer forming step, the aspect using the transfer film according to the disclosure will be described.

In this aspect, the photosensitive transparent resin layer is formed on the surface by laminating the transfer film according to the disclosure on the surface of the substrate for a touch panel on a side on which the electrode and the like are disposed, and transferring the photosensitive transparent resin layer of the transfer film according to the disclosure on the surface.

The laminating (transfer of the photosensitive transparent resin layer) can be performed using a well-known laminator such as a vacuum laminator or an auto-cut laminator.

As the laminating condition, a general condition can be applied.

A laminating temperature is preferably 80° C. to 150° C., more preferably 90° C. to 150° C., and particularly preferably 100° C. to 150° C.

As described above, in the aspect using the transfer film according to the disclosure, even in a case where the laminating temperature is a high temperature (for example, 120° C. to 150° C.), the occurrence of the development residue due to thermal fogging is prevented.

In a case of using a laminator including a rubber roller, the laminating temperature indicates a temperature of the rubber roller.

A temperature of the substrate at the time of laminating is not particularly limited. The temperature of the substrate at the time of laminating is 10° C. to 150° C., preferably 20° C. to 150° C., and more preferably 30° C. to 150° C. In a case of using a resin substrate as the substrate, the temperature of the substrate at the time of laminating is preferably 10° C. to 80° C., more preferably 20° C. to 60° C., and particularly preferably 30° C. to 50° C.

In addition, linear pressure at the time of laminating is preferably 0.5 N/cm to 20 N/cm, more preferably 1 N/cm to 10 N/cm, and particularly preferably 1 N/cm to 5 N/cm.

Further, a transportation speed (laminating speed) at the time of laminating is preferably 0.5 m/min to 5 m/min and more preferably 1.5 m/min to 3 m/min.

In a case of using the transfer film having a laminated structure of the protective film/photosensitive transparent resin layer/interlayer/thermoplastic resin layer/temporary support, first, the protective film is peeled off from the transfer film to expose the photosensitive transparent resin layer, the transfer film and the substrate for a touch panel are bonded to each other so that the exposed photosensitive transparent resin layer and the surface of the substrate for a touch panel on a side on which the electrode and the like are disposed are in contact with each other, and heating and pressurizing are performed. Accordingly, the photosensitive transparent resin layer of the transfer film is transferred onto the surface of the substrate for a touch panel on a side on which the electrode and the like are disposed, and a laminate having a laminated structure of temporary support/thermoplastic resin layer/interlayer/photosensitive transparent resin layer/electrode and the like/substrate is formed. In this laminated structure, the portion of "electrode and the like/substrate" is the substrate for a touch panel.

After that, the temporary support is peeled off from the laminate, if necessary. However, the pattern exposure which will be described later can be also performed, by leaving the temporary support.

As an example of the method of transferring the photosensitive transparent resin layer of the transfer film on the substrate for a touch panel and performing pattern exposure and development, a description disclosed in paragraphs 0035 to 0051 of JP2006-023696A can also be referred to.

<Pattern Exposure Step>

The pattern exposure step is a step of performing the pattern exposure with respect to the photosensitive transparent resin layer formed on the substrate for a touch panel.

Here, the pattern exposure indicates exposure of the aspect of performing the exposure in a pattern shape, that is, the aspect in which an exposed portion and an unexposed portion are present.

The exposed portion of the photosensitive transparent resin layer on the substrate for a touch panel in the pattern exposure is cured and finally becomes the cured film.

Meanwhile, the unexposed portion of the photosensitive transparent resin layer on the substrate for a touch panel in the pattern exposure is not cured, and is removed (dissolved) with a developer in the subsequent development step. With the unexposed portion, the opening of the cured film can be formed after the development step.

The pattern exposure may be exposure through a mask or may be digital exposure using a laser or the like.

As a light source of the pattern exposure, a light source can be suitably selected, as long as it can emit light at a wavelength region (for example, 365 nm or 405 nm) at which the photosensitive transparent resin layer can be cured. Examples of the light source include various lasers, a light emitting diode (LED), an ultrahigh pressure mercury lamp, a high pressure mercury lamp, and a metal halide lamp. An exposure intensity is preferably 5 mJ/cm$^2$ to 200 mJ/cm$^2$, and more preferably 10 mJ/cm$^2$ to 200 mJ/cm$^2$.

In a case where the photosensitive transparent resin layer is formed on the substrate using the transfer film, the pattern exposure may be performed after peeling the temporary support, or the temporary support may be peeled off after performing the exposure before peeling off the temporary support.

In addition, in the exposure step, the heat treatment (so-called post exposure bake (PEB)) may be performed with respect to the photosensitive transparent resin layer after the pattern exposure and before the development.

<Development Step>

The development step is a step of obtaining the electrode protective film for a touch panel which protects at least a portion of the electrode and the like, by developing the pattern-exposed photosensitive transparent resin layer (that is, by dissolving the unexposed portion of the pattern exposure with a developer).

A developer used in the development is not particularly limited, and a well-known developer such as a developer disclosed in JP1993-072724A (JP-H5-072724A) can be used.

As the developer, an alkali aqueous solution is preferably used.

Examples of the alkali compound which can be included in the alkali aqueous solution include sodium hydroxide, potassium hydroxide, sodium carbonate, potassium carbonate, sodium hydrogen carbonate, potassium hydrogencarbonate, tetramethyl ammonium hydroxide, tetraethyl ammonium hydroxide, tetrapropyl ammonium hydroxide, tetrabutylammonium hydroxide, and choline (2-hydroxyethyltrimethylammonium hydroxide).

The pH of the alkali aqueous solution at 25° C. is preferably 8 to 13, more preferably 9 to 12, and particularly preferably 10 to 12.

A content of the alkali compound in the alkali aqueous solution is preferably 0.1% by mass to 5% by mass and more preferably 0.1% by mass to 3% by mass with respect to a total amount of the alkali aqueous solution.

The developer may include an organic solvent having miscibility with water.

Examples of the organic solvent include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, ε-caprolactone, γ-butyrolactone, dimethylformamide, dimethylacetamide, hexamethylphosphoramide, ethyl lactate, methyl lactate, ε-caprolactam, and N-methylpyrrolidone. A concentration of the organic solvent is preferably 0.1% by mass to 30% by mass.

The developer may include a well-known surfactant. A concentration of the surfactant is preferably 0.01% by mass to 10% by mass.

A liquid temperature of the developer is preferably 20° C. to 40° C.

Examples of the development method include methods such as puddle development, shower development, shower and spin development, and dip development.

In a case of the shower development, the unexposed portion of the photosensitive transparent resin layer is removed by spraying the developer to the photosensitive transparent resin layer after the pattern exposure as a shower. In a case of using the transfer film including at least one of the photosensitive transparent resin layer, the thermoplastic resin layer, and the interlayer, after the transfer of these layers onto the substrate and before the development of the photosensitive transparent resin layer, an alkali solution having a low solubility of the photosensitive transparent resin layer may be sprayed as a shower, and at least one of the thermoplastic resin layer or the interlayer (both layers, in a case where both layers are present) may be removed in advance.

In addition, after the development, the development residue is preferably removed by spraying a cleaning agent with a shower and rubbing with a brush or the like.

A liquid temperature of the developer is preferably 20° C. to 40° C.

The development step may include a stage of performing the development, and a stage of performing the heat treatment (hereinafter, also referred to as "post baking") with respect to the cured film obtained by the development.

In a case where the substrate is a resin substrate, a temperature of the post baking is preferably 100° C. to 160° C. and more preferably 130° C. to 160° C.

A resistance value of the transparent electrode pattern can also be adjusted by this post baking.

In addition, in a case where the photosensitive transparent resin layer includes a carboxyl group-containing (meth) acrylic resin, at least a part of the carboxyl group-containing (meth)acrylic resin can be changed to carboxylic acid anhydride by the post baking. Accordingly, the cured film having excellent wet heat resistance after applying salt water is obtained.

In addition, the development step may include a stage of performing the development, and a stage of exposing the cured film obtained by the development (hereinafter, also referred to as "post exposure").

In a case where the development step includes a stage of performing the post exposure and a stage of performing the post baking, the post exposure and the post baking are preferably performed in this order.

Regarding the pattern exposure and the development, a description disclosed in paragraphs 0035 to 0051 of JP2006-023696A can be referred to, for example.

The preferred manufacturing method of the touch panel of the disclosure may include a step other than the steps described above. As the other step, a step (for example, washing step or the like) which may be provided in a normal photolithography step can be applied without any particular limitations.

(Image Display Apparatus)

The image display apparatus according to the disclosure includes the capacitive input device according to the disclosure, preferably, the touch panel according to the disclosure (for example, touch panels of the first and second specific examples).

As the image display apparatus according to the disclosure, a liquid crystal display apparatus having a structure in which the touch panel according to the disclosure is overlapped on a well-known liquid crystal display element is preferable.

As the structure of the image display apparatus including the touch panel, for example, a structure disclosed in "The latest Touch Panel Technology" (published 6 Jul. 2009, Techno Times), "Technologies and Developments of Touch Panels" supervised by Yuji Mitani, CMC Publishing CO., LTD. (2004, 12), FPD International 2009 Forum T-11 lecture text book, Cypress Semiconductor Corporation application note AN 2292 can be applied.

EXAMPLES

Hereinafter, the disclosure will be described more specifically with reference to examples. The material, the amount used, the ratio, the process contents, the process procedure, and the like shown in the following examples can be suitably changed, within a range not departing from a gist of the invention. Accordingly, the range of the disclosure is not limited to specific examples shown below. "part" and "%" are based on mass, unless otherwise noted.

In the following examples, a weight-average molecular weight of a resin is a weight-average molecular weight obtained by performing polystyrene conversion of a value measured by gel permeation chromatography (GPC). In addition, as the acid value, a theoretical acid value.

<Preparation of Photosensitive Transparent Layer Formation Coating Solution>

Materials A-1 to A-8 which are photosensitive transparent layer formation coating solution was prepared to have a composition shown in Table 1 shown below.

A numerical value shown with each structural unit of compounds A to C is a content ratio (molar ratio) of the corresponding structural unit. In addition, the weight-average molecular weights (Mw) of the compounds A to C were all 27,000.

TABLE 1

| | Material | Material A-1 | Material A-2 | Material A-3 | Material A-4 | Material A-5 | Material A-6 | Material A-7 | Material A-8 | Material A-9 |
|---|---|---|---|---|---|---|---|---|---|---|
| Polymerizable compound | Tricyclodecanedimethanol diacrylate (A-DCP, manufactured by Shin-Nakamura Chemical Co., Ltd.) | 5.60 | 5.60 | 5.60 | 5.60 | 5.60 | 5.60 | 5.60 | 5.60 | 5.60 |
| | Carboxyl acid-containing monomer ARONIX TO-2349 (manufactured by Toagosei Co., Ltd.) | 0.93 | 0.93 | 0.93 | 0.93 | 0.93 | 0.93 | 0.93 | 0.93 | 0.93 |
| | Ditrimethylolpropane tetraacrylate (AD-TMP, manufactured by Shin-Nakamura Chemical Co., Ltd.) | 2.80 | — | — | — | 2.80 | 2.80 | — | — | — |
| | Urethane acrylate 8UX-015A (manufactured by Taisei Fine Chemical Co., Ltd.) | — | 2.80 | 2.80 | 2.80 | — | — | 2.80 | 2.80 | 2.80 |
| Binder polymer | The following compound A (acid value 95 mgKOH/g) | 15.44 | 15.44 | 15.44 | 15.44 | — | — | 14.67 | 15.44 | 15.44 |
| | The following compound B (acid value 65 mgKOH/g) | — | — | — | — | 15.44 | — | — | — | — |
| | The following compound C (acid value 55 mgKOH/g) | — | — | — | — | — | 15.44 | — | — | — |
| | SMA EF40P (manufactured by Cravy Valley) | — | — | — | — | — | — | 0.77 | — | — |
| Photopolymerization initiator | 1-[9-ethyl-6-(2-methylbenzoyl)-9H-carbazol-3-yl]ethanone-1-(O-acetyloxime) (OXE-02, manufactured by BASF) | 0.11 | 0.11 | 0.11 | 0.11 | 0.11 | 0.11 | 0.11 | 0.11 | 0.11 |
| | 2-methyl-1-(4-methylthiophenyl)-2-morpholinopropan-1-one (Irgacure 907, manufactured by BASF) | 0.21 | 0.21 | 0.21 | 0.21 | 0.21 | 0.21 | 0.21 | 0.21 | 0.21 |
| Sensitizer | MTBD1 (manufactured by Showa Denko K.K.) | 0.03 | — | — | — | 0.03 | 0.03 | — | — | — |
| | N-phenylglycine | — | 0.03 | 0.03 | 0.03 | — | — | 0.03 | 0.03 | 0.03 |
| Blocked isocyanate compound | The following compound D | 3.62 | — | — | — | 3.62 | 3.62 | — | — | — |
| | Karenz AOI-BM (manufactured by Showa Denko K.K.) | — | 3.62 | — | — | — | — | 3.62 | — | — |
| | Karenz MOI-BM (manufactured by Showa Denko K.K.) | — | — | 3.62 | — | — | — | — | — | — |
| | 4-hydroxybutyl acrylate glycidyl ether (manufactured by Nippon Kasei Chemical Co., Ltd.) | — | — | — | 3.62 | — | — | — | — | — |
| | The following compound E (manufactured by Asahi Kasei Chemicals Corporation) | — | — | — | — | — | — | — | 4.83 | — |
| Additive | Benzimidazole (manufactured by Tokyo Chemical Industry Co., Ltd.) | 0.09 | — | — | — | 0.09 | 0.09 | — | 0.09 | 0.09 |
| | 1,2,4-triazole (manufactured by Otsuka Chemical Co.,Ltd.) | — | 0.09 | 0.09 | 0.09 | — | — | 0.09 | — | — |
| | MEGAFACE F551A (manufactured by DIC Corporation) | 0.16 | 0.16 | 0.16 | 0.16 | 0.16 | 0.16 | 0.16 | 0.16 | 0.16 |
| Solvent | 1-methoxy-2-propyl acetate | 31.01 | 31.01 | 31.01 | 31.01 | 31.01 | 31.01 | 31.01 | 29.80 | 34.63 |
| | Methyl ethyl ketone | 40.00 | 40.00 | 40.00 | 40.00 | 40.00 | 40.00 | 40.00 | 40.00 | 40.00 |
| | Polymenzable compound/binder polymer ratio | 0.60 | 0.60 | 0.60 | 0.60 | 0.60 | 0.60 | 0.60 | 0.60 | 0.60 |
| | Total (parts by mass) | 100 | 100 | 100 | 100 | 100 | 100 | 100 | 100 | 100 |

TO-2349: carboxylic acid-containing monomer (Toagosei Co., Ltd. "ARONIX (registered trademark) TO-2349"; mixture of pentafunctional ethylenically unsaturated compound and hexafunctional ethylenically unsaturated compound)

A ratio of each structural unit of the compounds A to C is molar ratio. Me represents a methyl group.

Compound A

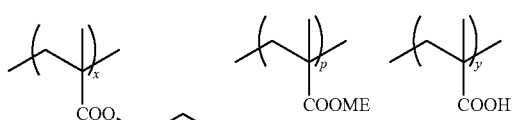

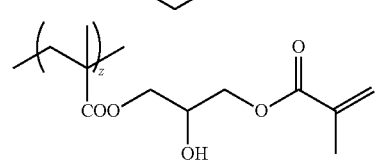

x/p/y/z = 51.5/2/26.5/20

Compound B

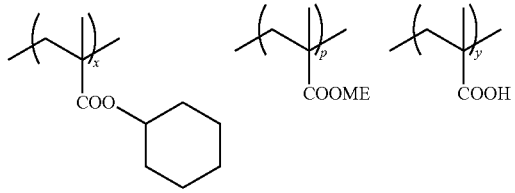

Compound C

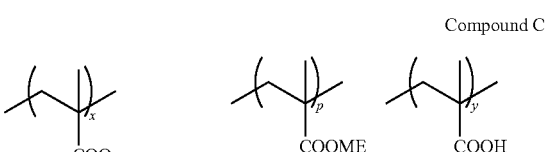

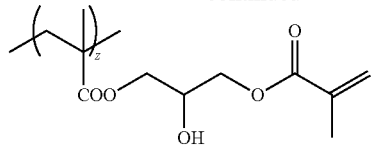

x/p/y/z = 43/2/20/35

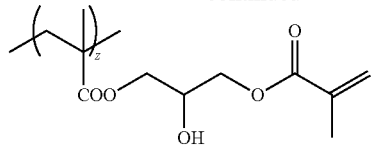

x/p/y/z = 62/2/16/20

SMA EF40P (Copolymer of styrene/maleic anhydride=4:1 (molar ratio), acid anhydride value: 1.94 mmol/g, weight-average molecular weight: 10,500, manufactured by Cray Valley)

MTBD1: 1,4-bis (3-mercaptobutyryloxy) butane, Karenz MTBD1 manufactured by Showa Denko K. K.

Compound D

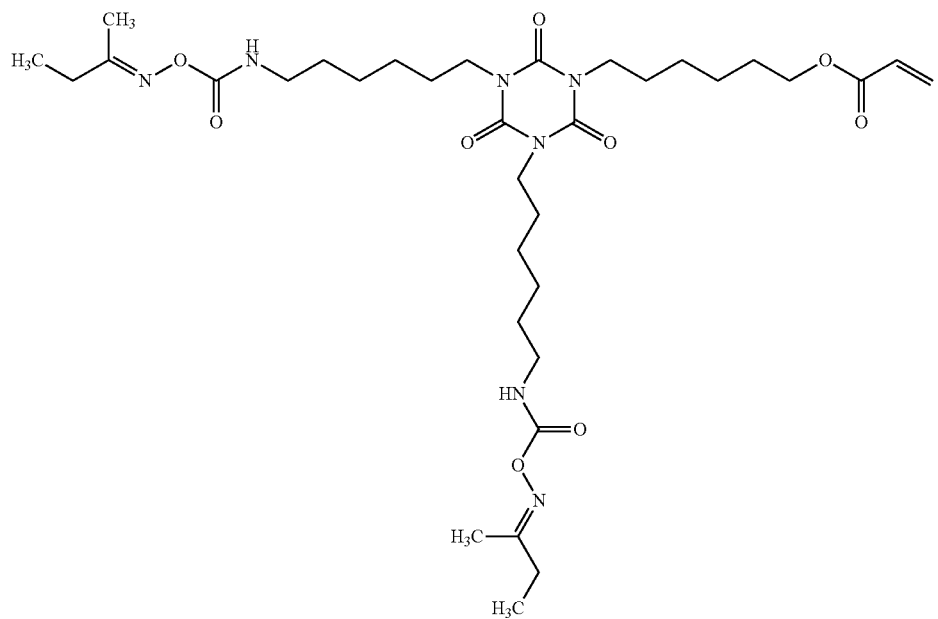

A compound D was synthesized by isocyanuric acid by using a well-known method.

Karenz AOI-BM: 2-(O-[1'-methylpropylideneamino]carbonylamino) ethyl acrylate, manufactured by Showa Denko K. K.

Karenz BOI-BM: 2-([1'-methylpropylideneamino]carboxyamino) ethyl methacrylate, manufactured by Showa Denko K. K.

coating amount to a coating amount so that a film thickness after drying becomes 8.0 μm, by using a slit-shaped nozzle, and accordingly, a photosensitive transparent resin layer was formed.

Regarding the polyethylene terephthalate film used, in a case where light of a white fluorescent light was emitted, in a state where the film is suspended, and the reflected light was visually observed, no deformations were confirmed on

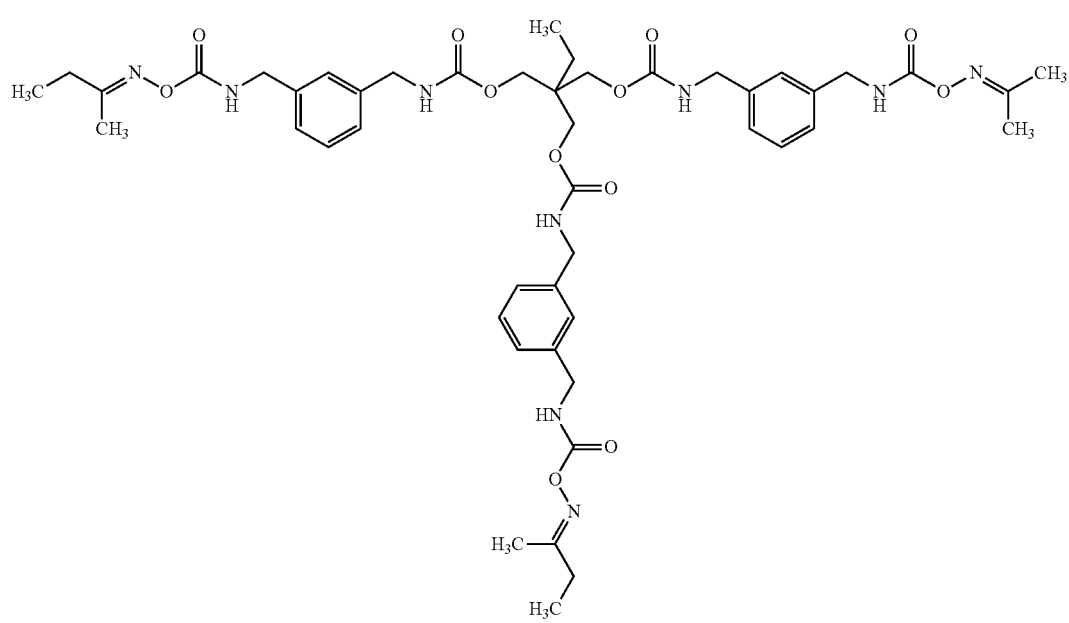

Compound E

<Preparation of Second Transparent Resin Layer Formation Coating Solution>

Next, materials B-1 and B-2 which are second transparent resin layer formation coating solutions were prepared with a composition shown in Table 2.

the film, and in a case where light of a green lamp (manufactured by Funatech CO., Ltd., FY-100R) was emitted, in a state where the film is suspended, and the transmitted light was visually observed, no scratches were confirmed on the film.

TABLE 2

| Material | Material B-1 | Material B-2 |
|---|---|---|
| NANOUSE OZ-S30M: $ZrO_3$ particles methanol dispersion liquid (non-volatilized amount 30.5%, manufactured by Nissan Chemical Industries, Ltd.) | 4.34 | 3.88 |
| Monoisopropanolamine (manufactured by Mitsui Chemicals, Inc.) | 0.22 | 0.22 |
| Binder polymer  Copolymer resin of methacrylic acid/allyl methacrylate (Mw:38,000, composition ratio = 40/60 (molar ratio)) | 0.20 | 0.32 |
| ARUFON UC-3520 (manufactured by Toagosei Co., Ltd.) | 0.05 | 0.05 |
| Carboxylic acid-containing monomer ARONIX TO-2349 (manufactured by Toagosei Co., Ltd.) | 0.04 | 0.03 |
| Benzotriazole BT-LX (manufactured by Johoku Chemical Co., Ltd.) | — | 0.03 |
| 1,2,4-triazole (manufactured by Otsuka Chemical Co., Ltd.) | 0.03 | — |
| MEGAFACE F444 (manufactured by DIC Corporation) | 0.01 | 0.01 |
| Ion exchange water | 29.1 | 29.5 |
| Methanol | 66.0 | 66.0 |
| Total (parts by mass) | 100 | 100 |

<Preparation of Transfer Films of Examples 1 to 8 and Comparative Examples 1 and 2>

Any one kind of materials A-1 to A-9 for forming photosensitive transparent layer shown in Table 3 or 4 was applied on a temporary support having a thickness of 16 μm which is a polyethylene terephthalate film by adjusting a After volatilizing the solvent in a drying zone at 100° C., at least one kind of materials B-1 and B-2 for forming second transparent resin layer in a combination of Table 3 or 4 was applied on the photosensitive transparent resin layer by adjusting the coating amount to an amount so that the film thickness after drying becomes a film thickness of 80 nm, by using a slit-shaped nozzle, and dried at a dry temperature of 80° C., and accordingly, a second transparent resin layer was formed. A protective film (polyethylene phthalate film having a thickness of 16 μm) was pressed on the second transparent resin layer, and each transfer film of Examples 1 to 8 and Comparative Examples 1 and 2 was manufactured.

Among these, in Example 5, after forming the photosensitive transparent resin layer, the second transparent resin layer was not laminated, the protective film was pressed on the photosensitive transparent resin layer, and accordingly, the transfer film was manufactured.

In each transfer film of Examples 1 to 4 and 6 to 9, each refractive index of the photosensitive transparent resin layer and the second transparent resin layer was measured. In all examples, it was confirmed that the refractive index of the second transparent resin layer was higher than the refractive index of the photosensitive transparent resin layer.

<Manufacturing of Transparent Electrode Pattern Film Used in Laminate Manufacturing>

(Formation of Transparent Film)

A cycloolefin resin film having a film thickness of 38 μm and a refractive index of 1.53 was subjected to a corona discharge treatment for 3 seconds under the conditions of an output voltage of 100%, an output of 250 W, an electrode length of 240 mm, and a length between work electrodes of 1.5 mm using a wire electrode having a diameter of 1.2 mm, and surface modification was performed. The obtained film was set as a transparent film substrate.

Next, the material of the material —C shown in Table 4 was applied on a transparent film substrate by using a slit-shaped nozzle, irradiated with an ultraviolet light (integral of light of 300 mJ/cm$^2$), and dried at approximately 110° C., and accordingly, a transparent film having a refractive index of 1.60 and a film thickness of 80 nm was manufactured.

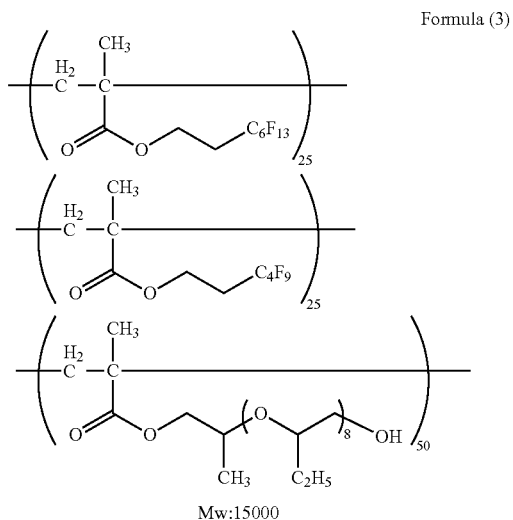

Formula (3)

Mw:15000

<Formation of Transparent Electrode Pattern>

A film in which a transparent film was laminated on a transparent film substrate obtained as described above was introduced into a vacuum chamber, an ITO thin film having a thickness of 40 nm and a refractive index of 1.82 was formed using ITO target having $SnO_2$ content of 10% by mass (Indium:Tin=95:5 (molar ratio)) by a direct current (DC) magnetron sputtering (condition: temperature of transparent film substrate: 150° C., argon pressure: 0.13 Pa, oxygen pressure: 0.01 Pa), and a film in which a transparent film and a transparent electrode layer were formed on the transparent film substrate was obtained. A surface resistance of the ITO thin film was 80Ω/□ (square per Ω).

(Manufacturing of Photosensitive Film for Etching E1)

A thermoplastic resin layer coating solution formed of the following list H1 was applied and dried on a temporary

TABLE 3

| Material | Material-C |
| --- | --- |
| $ZrO_2$: ZR-010 manufactured by Solar Co., Ltd. | 2.08 |
| DPHA solution (dipentaerythritol hexa-acrylate: 38%, dipentaerythritol penta-acrylate: 38%, 1-methoxy-2-propyl acetate: 24%) | 0.29 |
| Urethane monomer: UK oligo UA-32P manufactured by Shin-Nakamura Chemical Co., Ltd.: non-volatilized amount 75%, 1-methoxy-2-propyl acetate: 25% | 0.14 |
| Monomer mixture (polymerizable compound (b2-1) disclosed in paragraph [0111] of JP2012-078528A, n = 1: tripentaerythritol octaacrylate content 85%, total of n = 2 and n = 3 as impurities is 15%) | 0.36 |
| Polymer solution 1 (structural formula disclosed in paragraph [0058] of JP2008-146018A: weight-average molecular weight = 35,000, solid content: 45%, 1-methoxy-2-propyl acetate: 15%, 1-methoxy-2-propanol: 40%) | 1.89 |
| Photo-radical initiator: 2-benzyl-2-dimethylamino-1-(4-morpholinophenyl)-butane (Irgacure (registered trademark) 379, manufactured by BASF Japan Ltd.) | 0.03 |
| Photopolymerization initiator: KAYACURE-DETX-S (manufactured by Nippon Kayaku Co., Ltd., alkyl thioxanthone) | 0.03 |
| Polymer solution 2 (polymer of structural formula represented by Formula (3), solution having weight-average molecular weight of 15,000, non-volatilized amount: 30% by mass, methyl ethyl ketone: 70% by mass) | 0.01 |
| 1-methoxy-2-propyl acetate | 38.73 |
| Methyl ethyl ketone | 56.80 |
| Total (parts by mass) | 100 | support of a polyethylene terephthalate film having a thickness of 75 μm using a slit-shaped nozzle. Next, an interlayer coating solution formed of the following list P1 was applied and dried. Then, a photocuring resin layer coating solution for etching formed of the following list E1 was applied and dried. A laminate formed of a thermoplastic resin layer having a dried film thickness of 15.1 μm, an interlayer having a dried film thickness of 1.6 μm, and a photocuring resin layer for etching having a film thickness of 2.0 μm on the temporary support was obtained by the method described above, and finally a protective film (polypropylene film having a thickness of 12 μm) was pressed against the laminate. By doing so, a photosensitive film for etching E1 which is a transfer material in which the temporary support, the thermoplastic resin layer, the interlayer (oxygen shielding film), and the photocuring resin layer for etching were integrally formed, was manufactured.

(Photocuring Resin Layer Coating Solution for Etching: List E1)
  Methyl methacrylate/styrene/methacrylate copolymer (copolymer composition (% by mass): 31/40/29, weight-average molecular weight: 60,000, acid value: 163 mgKOH/g): 16 parts by mass
  Monomer 1 (product name: BPE-500, manufactured by Shin-Nakamura Chemical Co., Ltd.): 5.6 parts by mass
  Tetraethylene oxide monomethacrylate of hexamethylene diisocyanate 0.5 mol additive: 7 parts by mass
  Cyclohexane dimethanol monoacrylate as a compound including one polymerizable group in a molecule: 2.8 parts by mass
  2-chloro-N-butyl acridone: 0.42 parts by mass
  2,2-bis (o-chlorophenyl)-4,4',5,5'-tetraphenylbiimidazole: 2.17 parts by mass
  Malachite green oxalate: 0.02 parts by mass
  Leuco Crystal Violet: 0.26 parts by mass
  Phenothiazine: 0.013 parts by mass
  Surfactant (product name: MEGAFACE F-750F, manufactured by DIC Corporation): 0.03 parts by mass
  Methyl ethyl ketone: 40 parts by mass
  1-Methoxy-2-propanol: 20 parts by mass A viscosity at 100° C. after removing a solvent of the photocuring resin layer coating solution for etching E1 was 2,500 Pa·sec.

(Thermoplastic Resin Layer Coating Solution: List H1)
  Methanol: 11.1 parts by mass
  Propylene glycol monomethyl ether acetate: 6.36 parts by mass
  Methyl ethyl ketone: 52.4 parts by mass
  Methyl methacrylate/2-ethylhexyl acrylate/benzyl methacrylate/methacrylic acid copolymer (copolymer composition ratio (molar ratio)=55/11.7/4.5/28.8, molecular weight=100,000, Tg≈70° C.: 5.83 parts by mass
  Styrene/acrylic acid copolymer (copolymer composition ratio (molar ratio)=63/37, weight-average molecular weight=10,000, Tg 100° C.): 13.6 parts by mass
  Monomer 1 (product name: BPE-500, manufactured by Shin-Nakamura Chemical Co., Ltd.): 9.1 parts by mass
  Fluorine-based polymer [component shown below]: 0.54 parts by mass
  Fluorine-based polymer: copolymer of 40 parts by mass of $C_6F_{13}CH_2CH_2OCOCH=CH_2$, 55 parts by mass of $(OCH(CH_3)CH_2)_7OCOCH=CH_2$, and 5 parts by mass of $H(OCHCH_2)_7OCOCH=CH_2$ (weight-average molecular weight: 30,000, methyl ketone 30% by mass solution, product name: MEGAFACE F780F, manufactured by DIC Corporation)

(Interlayer Coating Solution: List P1)
  Polyvinyl alcohol (product name: PVA205, manufactured by Kuraray Co., Ltd., saponification degree=88%, polymerization degree: 550): 32.2 parts by mass
  Polyvinyl pyrrolidone (product name: K-30, manufactured by ISP Japan): 14.9 parts by mass
  Distilled water: 524 parts by mass
  Methanol: 429 parts by mass —Formation of Transparent Electrode Pattern—

The film in which the transparent film and the transparent electrode layer were formed on the transparent film substrate was washed, and a photosensitive film for etching E1, from which the protective film was removed, was laminated. The laminating was performed at a temperature of a transparent film substrate of 130° C., a rubber roller temperature of 120° C., a linear pressure of 100 N/cm, and a transportation speed of 2.2 m/min.

After peeling the temporary support, a distance between a surface of an exposure mask (quartz exposure mask including a transparent electrode pattern) and the photocuring resin layer for etching described above was set as 200 μm, and the pattern exposure was performed with an exposure amount of 50 mJ/cm$^2$ (i ray).

Next, a triethanolamine-based developer (containing 30% by mass of triethanolamine, liquid obtained by 10-fold diluting product name: T-PD2 (Fujifilm Holdings Corporation) with pure water) was treated at 25° C. for 100 seconds, a surfactant-containing washing solution (liquid obtained by 10-fold diluting product name: T-SD3 (Fujifilm Holdings Corporation) with pure water) was treated at 33° C. for 20 seconds, the removal of residue was performed with a rotating brush or an ultrahigh pressure washing nozzle, a post baking treatment was performed at 130° C. for 30 minutes, and a film in which the transparent film, the transparent electrode layer, and the photocuring resin layer pattern for etching were formed on the transparent film substrate was obtained.

The film in which the transparent film, the transparent electrode layer, and the photocuring resin layer pattern for etching were formed on the transparent film substrate was dip in an etching tank including an ITO etching solution (hydrochloric acid, potassium chloride aqueous solution, liquid temperature of 30° C.) and treated for 100 seconds, the transparent electrode layer in an exposed region which is not covered with the photocuring resin layer for etching was dissolved and removed, and a film attached with a transparent electrode pattern having the photocuring resin layer pattern for etching was obtained.

Next, the film attached with a transparent electrode pattern having the photocuring resin layer pattern for etching was dip in a resist peeling tank including a resist peeling solution (N-methyl-2-pyrrolidone, monoethanolamine, surfactant (product name: SURFYNOL 465, manufactured by Air Products Japan, Inc., liquid temperature: 45° C.), and treated for 200 seconds, the photocuring resin layer for etching was removed, and a film in which the transparent film and the transparent electrode pattern were formed on the transparent film substrate was obtained.

<Manufacturing of Transparent Laminate>

The transparent film and the transparent electrode pattern of the film in which the transparent film and the transparent electrode pattern were formed on the transparent film substrate were transferred onto a position covered with the transfer film, by using the transfer film of each example and comparative example, from which the protective film was peeled off. As a result, the second transparent resin layer, the photosensitive transparent resin layer, and the temporary support were transferred on the transparent film and the transparent electrode pattern included in the transparent film substrate in this order, by the transfer film. The transfer was performed under the conditions of a temperature of the transparent film substrate of 40° C., a rubber roller temperature of 110° C., and linear pressure of 3 N/cm, and a transportation speed of 2 m/min.

After that, a distance between a surface of an exposure mask (quartz exposure mask including a pattern for forming overcoat) and the temporary support was set as 125 μm, and the pattern exposure was performed with an exposure amount of 100 mJ/cm$^2$ (i ray) through the temporary support, by using a proximity type exposure machine including an ultrahigh pressure mercury lamp (manufactured by Hitachi High-Technologies Corporation).

After peeling off the temporary support, a development treatment was performed with soda carbonate 2% aqueous solution at 32° C. for 60 seconds. After that, the residue was removed by ejecting ultrapure water to a transparent film substrate after the development treatment, from the ultrahigh pressure washing nozzle. Then, moisture on the transparent film substrate was removed by blowing air, a post baking treatment was performed at 145° C. for 30 minutes, and a transparent laminate in which the transparent film, the transparent electrode pattern, the cured second transparent resin layer, and the cured photosensitive transparent resin layer were laminated on the transparent film substrate in the order from the substrate, was formed.

[Evaluation of Transparent Laminate]

<Evaluation of Transparent Electrode Pattern Concealing Properties>

A black PET material was bonded to the transparent film substrate side with respect to the transparent laminate in which the transparent film, the transparent electrode pattern, the cured second transparent resin layer, and the cured photosensitive transparent resin layer were laminated on the transparent film substrate in the order from the substrate, through the transparent bonding tape (manufactured by 3M Japan, product name, OCA tape 8171CL), and the entire substrate was light-shielded.

In a darkroom, the laminate was irradiated with light of a fluorescent lamp from a side opposite to the black PET material, and the recognition of the transparent electrode pattern was evaluated by visually observing the reflected light obliquely.

A, B, C, or D is practical levels, A or B is preferable, and A is more preferable.

<<Evaluation Standard>>

A: even in a case of stared from a distance of 15 cm, the transparent electrode pattern was not visually recognized, and even in a case of normally seen from a distance of 40 cm, the transparent electrode pattern was not visually recognized.

B: in a case of stared from a distance of 15 cm, the transparent electrode pattern was slightly visually recognized, and in a case of normally seen from a distance of 40 cm, the transparent electrode pattern was not visually recognized.

C: in a case of stared from a distance of 15 cm, the transparent electrode pattern was slightly visually recognized, and in a case of normally seen from a distance of 40 cm, the transparent electrode pattern was slightly visually recognized.

D: in a case of stared from a distance of 15 cm, the transparent electrode pattern was clearly visually recognized, and in a case of normally seen from a distance of 40 cm, the transparent electrode pattern was slightly visually recognized.

E: in a case of stared from a distance of 15 cm, the transparent electrode pattern was clearly visually recognized, and in a case of normally seen from a distance of 40 cm, the transparent electrode pattern was clearly visually recognized.

<Surface Shape Evaluation of Surface of Cured Photosensitive Transparent Resin Layer>

After the pattern exposure treatment at 100 mJ/cm$^2$ (i ray) described above, a development treatment was performed with soda carbonate 2% aqueous solution at 36° C. for 120 seconds after peeling off the temporary support, as forced condition. After that, rinse washing was performed with ultrapure water, the moisture was removed by blowing air, the surface of the cured photosensitive transparent resin layer was observed, and the surface shape was evaluated based on the following standard.

<<Evaluation Standard>>

A: Even in a case of visually seen or observed with an optical microscope at magnification of 200, no defects (swelling or depression) were confirmed on the surface of the cured photosensitive transparent resin layer.

B: In a case of visually seen, no defects were confirmed on the surface of the cured photosensitive transparent resin layer, but in a case of observed with an optical microscope at magnification of 200, defects were confirmed.

C: In a case of visually seen or observed with an optical microscope at magnification of 200, defects were confirmed on the surface of the cured photosensitive transparent resin layer.

<Evaluation of Wet Heat Resistance After Applying Salt Water>

The second transparent resin layer and the photosensitive transparent resin layer were transferred onto a PET film (manufactured by GEOMATEC Co., Ltd.) on which a copper foil (substitution of electrode of the capacitive input device) was laminated, by using the transfer film of each example and the comparative example, from which the protective film was peeled off, in the same manner as in the method of transferring to the film in which the transparent film and the transparent electrode pattern were formed on the transparent film substrate, and a sample subjected to a post-process (peeling, development, or post-baking of the temporary support) was obtained.

5 cm$^3$ of salt water having a concentration of 50 g/L was added dropwise to a film surface of the photosensitive transparent resin layer of the sample and evenly spread to an area of 50 cm$^2$, the moisture was volatilized at room temperature, and the time elapsed at high temperature and high humidity (85° C., relative humidity of 85%) for 72 hours. After that, the salt water was wiped, and the surface state of the sample was observed and evaluated based on the following points.

A or B is a necessary level in practice and A is preferable.

<<Evaluation Standard>>

A: no changes were found from copper, the surface of the cured second transparent resin layer, and the surface of the cured photosensitive transparent resin layer.

B: portions where the color is slightly darkened were observed on the surface of the cured second transparent resin layer and the surface of the cured photosensitive transparent resin layer, but no changes were found from copper.

C: color of copper was changed.

<Evaluation of Development Speed>

Without performing the pattern exposure described above, the temporary support was peeled off, the development treatment was performed with soda carbonate 2% aqueous solution at 32° C., and the development treatment was visually evaluated for a period of time until the photosensitive transparent resin layer and the second transparent resin layer were removed. It is preferable to remove the layers described above for a period of time as short as possible with respect to the actual treatment time, as the meaning of ensuring a margin with respect to the development.

A or B is a necessary level in practice and A is preferable.

<<Evaluation Standard>>

A: can perform the development for shorter than 30 seconds

B: can perform the development for shorter than 45 seconds

C: 45 or longer seconds is necessary for development and removal

Table 4 shows the evaluation results.

All of the documents, the patent applications, and the technology standards described here are incorporated here by reference.

EXPLANATION OF REFERENCES

10: transfer film
12: temporary support
16: protective film
18: photosensitive transparent resin layer (electrode protective film for touch panel)
20, 20A: second transparent resin layer (first refractive index adjusting layer)
30: touch panel
32: substrate
34: transparent electrode pattern

TABLE 4

|  |  | Photosensitive transparent resin layer |  |  |  |  | Second transparent resin layer |  | Evaluation |  |  |  |
|---|---|---|---|---|---|---|---|---|---|---|---|---|
|  | Material | Acid value of binder polymer (mgKOH/g) | Compound capable of reacting with acid due to heating | Functional group capable of reacting with acid due to heating | Polymerizable group | Refractive index | Material | Refractive index | Surface shape of cured photosensitive transparent resin layer surface | wet heat resistance after applying salt water | Development speed | Concealing properties of transparent electrode pattern |
| Example 1 | Material A-1 | 95 | Compound D | Blocked isocyanate group | Acryloxy group | 1.51 | Material B-1 | 1.68 | A | A | A | A |
| Example 2 | Material A-2 | 95 | Karenz AOI-BM | Blocked isocyanate group | Acryloxy group | 1.51 | Material B-2 | 1.65 | A | A | A | A |
| Example 3 | Material A-3 | 95 | Karenz MOI-BM | Blocked isocyanate group | Methacryloxy group | 1.51 | Material B-1 | 1.68 | A | A | A | A |
| Example 4 | Material A-4 | 95 | 4-hydroxybutyl acrylate glycidyl ether | Glycidyl group | Acryloxy group | 1.51 | Material B-1 | 1.68 | A | A | B | A |
| Example 5 | Material A-2 | 95 | Karenz AOI-BM | Blocked isocyanate group | Acryloxy group | 1.51 | None | — | A | A | A | D |
| Example 6 | Material A-5 | 65 | Compound D | Blocked isocyanate group | Acryloxy group | 1.51 | Material B-1 | 1.68 | A | A | A | A |
| Example 7 | Material A-6 | 55 | Compound D | Blocked isocyanate group | Acryloxy group | 1.51 | Material B-1 | 1.68 | A | A | B | A |
| Example 8 | Material A-7 | 95 | Karenz AOI-BM | Blocked isocyanate group | Acryloxy group | 1.51 | Material B-1 | 1.68 | A | A | A | A |
| Comparative Example 1 | Material A-8 | 95 | Compound E | Blocked isocyanate group | None | 1.51 | Material B-1 | 1.68 | C | A | A | A |
| Comparative Example 2 | Material A-9 | 95 | None | — | — | 1.51 | Material B-1 | 1.68 | A | C | A | A |

From Table 4, a laminate having excellent surface shape of the surface of the cured photosensitive transparent resin layer and excellent display properties, while ensuring wet heat resistance after applying salt water was obtained by including a polymerizable group and adding a compound capable of reacting with acid due to heating.

The contents of JP2016-238870A filed on Dec. 8, 2016 and JP2017-114643A filed on Jun. 9, 2017 are incorporated herein by reference.

36: second refractive index adjusting layer
40: first region where transparent electrode pattern is present
42: second region where transparent electrode pattern is not present
56: leading wiring
70: first transparent electrode pattern
72: second transparent electrode pattern
74: image display region 75: image non-display region
90: touch panel

What is claimed is:

1. A transfer film comprising:
a temporary support; and
a photosensitive transparent resin layer positioned on the temporary support,
wherein the photosensitive transparent resin layer includes a binder polymer, an ethylenically unsaturated compound, a photopolymerization initiator, and
a blocked isocyanate compound including a polymerizable group,
and wherein the dissociation temperature of the blocked isocyanate compound is 100° C. to 160° C.

2. The transfer film according to claim 1,
wherein the binder polymer is an alkali soluble resin having an acid value equal to or greater than 60 mgKOH/g.

3. The transfer film according to claim 1, further comprising:
a second transparent resin layer on the photosensitive transparent resin layer,
wherein a refractive index of the second transparent resin layer is higher than a refractive index of the photosensitive transparent resin layer.

4. The transfer film according to claim 1,
wherein the polymerizable group in the blocked isocyanate compound is an ethylenically unsaturated group.

5. The transfer film according to claim 4,
wherein the polymerizable group in the blocked isocyanate compound is a (meth)acryloxy group.

6. The transfer film according to claim 1,
wherein the ethylenically unsaturated compound includes an ethylenically unsaturated compound including an acid group.

7. An electrode protective film, comprising:
the transfer film according to claim 1 from which the temporary support has removed.

8. A laminate comprising: a photosensitive transparent resin layer obtained by removing the temporary support from the transfer film according to claim 1, on a substrate including an electrode of a capacitive input device, in order from the substrate side.

9. A capacitive input device comprising the electrode protective film according to claim 7.

10. A capacitive input device comprising the laminate according to claim 8.

11. A manufacturing method of a touch panel comprising:
preparing a substrate for a touch panel having a structure in which at least one of an electrode for a touch panel or a wiring for a touch panel is disposed on a substrate;
forming a photosensitive layer on a surface of the substrate for a touch panel on a side where at least one of the electrode for a touch panel or the wiring for a touch panel is disposed, by using the transfer film a-according to claim 1;
performing pattern-exposing on the photosensitive layer formed on the substrate for a touch panel; and
developing the pattern-exposed photosensitive layer to obtain a protective film for a touch panel which protects at least a part of at least one of the electrode for a touch panel or the wiring for a touch panel.

* * * * *